US011862649B2

(12) United States Patent
Yoneda et al.

(10) Patent No.: US 11,862,649 B2
(45) Date of Patent: Jan. 2, 2024

(54) IMAGING DEVICE, OPERATION METHOD THEREOF, AND ELECTRONIC DEVICE

(71) Applicant: SEMICONDUCTOR ENERGY LABORATORY CO., LTD., Atsugi (JP)

(72) Inventors: Seiichi Yoneda, Isehara (JP); Hidetomo Kobayashi, Kanagawa (JP); Takashi Nakagawa, Kangawa (JP); Yusuke Negoro, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 18/117,784

(22) Filed: Mar. 6, 2023

(65) Prior Publication Data

US 2023/0207585 A1 Jun. 29, 2023

Related U.S. Application Data

(62) Division of application No. 17/057,526, filed as application No. PCT/IB2019/054838 on Jun. 11, 2019, now Pat. No. 11,600,645.

(30) Foreign Application Priority Data

Jun. 21, 2018 (JP) ................... 2018-117769

(51) Int. Cl.
*H04N 25/79* (2023.01)
*H04N 25/532* (2023.01)
(Continued)

(52) U.S. Cl.
CPC ..... *H01L 27/14612* (2013.01); *H04N 25/531* (2023.01); *H04N 25/532* (2023.01);
(Continued)

(58) Field of Classification Search
CPC ...... H04N 25/53; H04N 25/532; H04N 25/75; H04N 25/78; H04N 25/79; H01L 27/14612
See application file for complete search history.

(56) References Cited

U.S. PATENT DOCUMENTS

| 9,093,575 B2 | 7/2015 | Yokoyama |
| 9,577,005 B2 | 2/2017 | Yokoyama |

(Continued)

FOREIGN PATENT DOCUMENTS

| CN | 103715175 A | 4/2014 |
| CN | 109196647 A | 1/2019 |

(Continued)

OTHER PUBLICATIONS

International Search Report (Application No. PCT/IB2019/054838) dated Sep. 24, 2019.

(Continued)

*Primary Examiner* — Daniel M Pasiewicz
(74) *Attorney, Agent, or Firm* — NIXON PEABODY LLP; Jeffrey L. Costellia

(57) ABSTRACT

An imaging device that can obtain imaging data corresponding to high-resolution images in a short period of time is provided. The imaging device includes a pixel including a photoelectric conversion element and n (n is an integer more than 2 inclusive) retention circuits. The photoelectric conversion element and the n retention circuits are stacked. One electrode of the photoelectric conversion element is electrically connected to the first to n-th retention circuits. The retention circuits include OS transistors with an extremely low off-state current feature, and can retain imaging data for a long time. In the first to n-th periods, the imaging device obtains the first to n-th imaging data and retains it in the first to n-th retention circuits. Then, the first to n-th imaging data retained in the first to n-th retention circuits are read out. The (Continued)

read imaging data is output outside the imaging data through AD conversion.

6 Claims, 20 Drawing Sheets

(51) Int. Cl.
    *H04N 25/78*     (2023.01)
    *H01L 27/146*     (2006.01)
    *H04N 25/75*     (2023.01)
    *H04N 25/531*     (2023.01)
    *H04N 25/771*     (2023.01)

(52) U.S. Cl.
    CPC ........... *H04N 25/75* (2023.01); *H04N 25/771* (2023.01); *H04N 25/78* (2023.01); *H04N 25/79* (2023.01)

(56) References Cited

U.S. PATENT DOCUMENTS

| | | |
|---|---|---|
| 9,711,549 B2 | 7/2017 | Yamazaki et al. |
| 9,773,832 B2 | 9/2017 | Kurokawa |
| 9,883,129 B2 | 1/2018 | Kurokawa |
| 9,935,143 B2 | 4/2018 | Ohmaru et al. |
| 9,947,710 B2 | 4/2018 | Yokoyama |
| 10,319,775 B2 | 6/2019 | Yokoyama |
| 10,455,174 B2 | 10/2019 | Ikeda |
| 10,615,214 B2 | 4/2020 | Yokoyama |
| 10,720,465 B2 | 7/2020 | Matsumoto et al. |
| 2013/0181316 A1 | 7/2013 | Tsukimura et al. |
| 2014/0091321 A1 | 4/2014 | Yokoyama |
| 2015/0279884 A1 | 10/2015 | Kusumoto |
| 2017/0094220 A1 | 3/2017 | Kurokawa |
| 2019/0081100 A1 | 3/2019 | Matsumoto et al. |
| 2019/0364188 A1* | 11/2019 | Sano ................. H04N 23/73 |
| 2020/0227463 A1 | 7/2020 | Yokoyama |
| 2020/0258934 A1 | 8/2020 | Matsumoto et al. |

FOREIGN PATENT DOCUMENTS

| | | |
|---|---|---|
| EP | 3439039 A | 2/2019 |
| JP | 2011-119711 A | 6/2011 |
| JP | 2014-072418 A | 4/2014 |
| JP | 2016-086164 A | 5/2016 |
| JP | 2016-213298 A | 12/2016 |
| JP | 2017-055401 A | 3/2017 |
| JP | 2017-063420 A | 3/2017 |
| WO | WO-2016/056396 | 4/2016 |
| WO | WO-2017/169480 | 10/2017 |

OTHER PUBLICATIONS

Written Opinion (Application No. PCT/IB2019/054838) dated Sep. 24, 2019.

* cited by examiner

510A

510E

FIG. 18A1
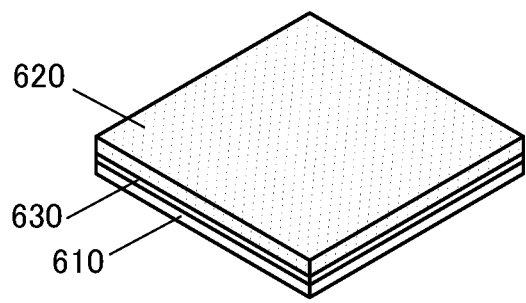
FIG. 18B1
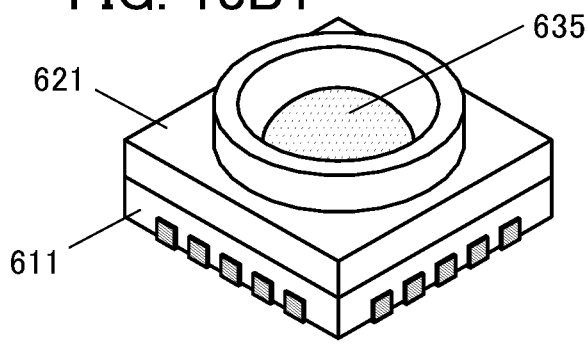
FIG. 18A2
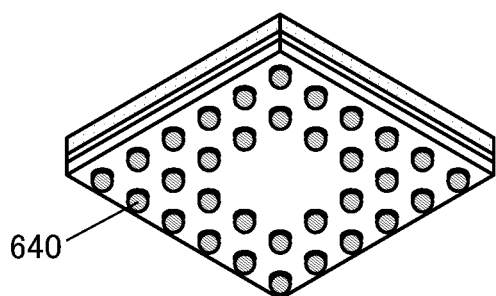
FIG. 18B2
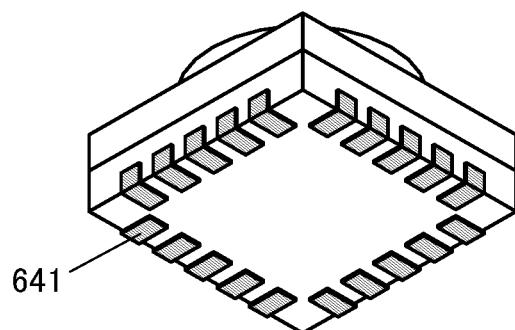
FIG. 18A3
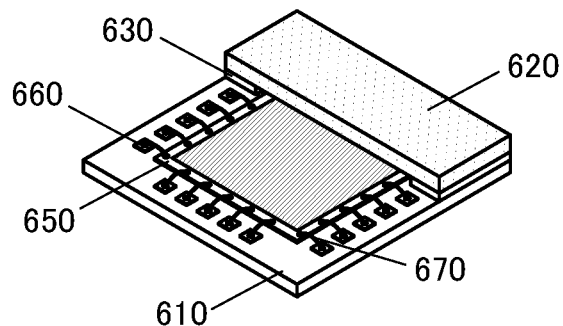
FIG. 18B3
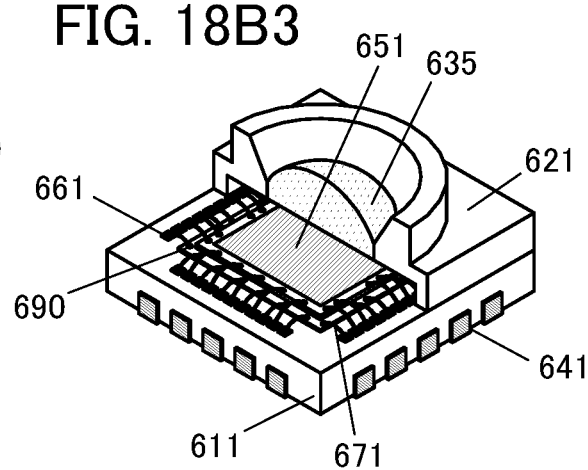

IMAGING DEVICE, OPERATION METHOD THEREOF, AND ELECTRONIC DEVICE

TECHNICAL FIELD

One embodiment of the present invention relates to an imaging device and an operating method thereof, and an electronic device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique which forms a transistor by using an oxide semiconductor thin film formed over a substrate has attracted attention. An imaging device having a structure where a transistor including an oxide semiconductor with an extremely low off-state current is used in a pixel circuit is disclosed in Patent Document 1, for example.

Patent Document 2 discloses an imaging device capable of taking images in a short period, which can be used for a high-speed camera.

REFERENCE

Patent Document

[Patent Document 1] Japanese Published Patent Application No. 2011-119711
[Patent Document 2] Japanese Published Patent Application No. 2017-55401

SUMMARY OF THE INVENTION

Problems to be Solved by the Invention

The imaging device shown in Patent Document 2 achieves short interval image taking through the process in which two or more imaging data are obtained, each data is retained in a different pixel, and the retained imaging data are sequentially read out. Thus, the larger the number of imaging data which are taken at one time becomes, the smaller the number of pixels which can be used for obtaining and retaining one imaging data becomes; therefore, resolution of the image corresponding to the obtained imaging data becomes low.

One object of one embodiment of the present invention is to provide an imaging device which can obtain a plurality of imaging data in a short period. Another object is to provide an imaging device that operates at high speed. Another object is to provide an imaging device which can obtain imaging data corresponding to a high-resolution image. Another object is to provide an imaging device which can obtain imaging data corresponding to a high-quality image. Another object is to provide an imaging device with a high aperture ratio. Another object is to provide a high-sensitivity imaging device. Another object is to provide an imaging device with low power consumption. Another object is to provide an inexpensive imaging device. Another object is to provide a highly reliable imaging device. Another object is to provide a novel imaging device. Another object is to provide a novel semiconductor device or the like.

Another object of one embodiment of the present invention is to provide an operation method of an imaging device which can obtain a plurality of imaging data in a short period. Another object is to provide an operation method of an imaging device that operates at high speed. Another object is to provide an operation method of an imaging device which can obtain imaging data corresponding to high-resolution imaging data. Another object is to provide an operation method of an imaging device which can obtain imaging data corresponding to a high-quality image. Another object is to provide an operation method of an imaging device with a high aperture ratio. Another object is to provide an operation method of a high-sensitivity imaging device. Another object is to provide an operation method of an imaging device with low power consumption. Another object is to provide an operation method of an inexpensive imaging device. Another object is to provide an operation method of a highly reliable imaging device. Another object is to provide an operation method of a novel imaging device. Another object is to provide an operation method of a novel semiconductor device or the like.

Note that the description of these objects does not preclude the existence of other-objects. One embodiment of the present invention does not have to achieve all these objects. Other objects will be apparent from and can be derived from the description of the specification, the drawings, the claims, and the like.

Means for Solving the Problems

One embodiment of the present invention is an imaging device including a stack of a first layer, a second layer, and a third layer. The first includes a photoelectric conversion element. The second layer includes a first circuit. The third layer includes a second circuit. One electrode of the photoelectric conversion element is electrically connected to the first circuit. The one electrode of the photoelectric conversion element is electrically connected to the second circuit. The first circuit has a function of retaining first imaging data which is data corresponding to an illuminance of light emitted to the photoelectric conversion element. The second circuit has a function of retaining second imaging data which is data corresponding to an illuminance of light emitted to the photoelectric conversion element.

Alternatively, in the above embodiment, the first circuit includes a first transfer transistor. The second circuit includes a second transfer transistor. The one electrode of the photoelectric conversion element is electrically connected to one of a source and a drain of the first transfer transistor. The one electrode of the photoelectric conversion element may be electrically connected to one of a source and a drain of the second transfer transistor.

Alternatively, in the above embodiment, the one of the source and the drain of the first transfer transistor includes a region overlapping with the one of the source and the drain of the second transfer transistor. The other of the source and the drain of the second transfer transistor comprises a region overlapping with the other of the source and the drain of the second transfer transistor. A gate of the first transfer transistor may include a region overlapping with a gate of the second transfer transistor.

Alternatively, in the above embodiment, the first and second transfer transistors includes a metal oxide in a channel formation region. The metal oxide may include an element M (M is Al, Ga, Y, or Sn) and Zn.

Alternatively, in the above embodiment, the first circuit and the second circuit may include a similar structure.

Alternatively, in the above embodiment, the second layer includes a first AD conversion circuit. The third layer includes a second AD conversion circuit. The first AD conversion circuit and the second AD conversion circuit may include a region overlapping with each other.

Alternatively, in the above embodiment, the first layer includes a multiplexer circuit and an AD conversion circuit. A first input terminal of the multiplexer circuit is electrically connected to the first circuit. A second input terminal of the multiplexer circuit is electrically connected to the second circuit. An output terminal of the multiplexer circuit may be electrically connected to the AD conversion circuit.

Alternatively, in the above embodiment, the first circuit includes the first transfer transistor, a first reset transistor, a first amplification transistor, and a first selection transistor. The other of the source and the drain of the first transfer transistor is electrically connected to one of a source and a drain of the first reset transistor. The one of the source and the drain of the first reset transistor is electrically connected to a gate of the first amplification transistor. One of a source and a drain of the first amplification transistor may be electrically connected to one of a source and a drain of the first selection transistor.

Alternatively, in the above embodiment, the first transfer transistor, the first reset transistor, the first amplification transistor, and the first selection transistor include a metal oxide in a channel formation region. The metal oxide may include an element M (M is Al, Ga, Y, or Sn) and Zn.

Alternatively, in the above embodiment, the second circuit includes the second transfer transistor, a second reset transistor, a second amplification transistor, and a second selection transistor. The other of the source and the drain of the second transfer transistor is electrically connected to one of a source and a drain of the second reset transistor. The one of the source and the drain of the second reset transistor is electrically connected to a gate of the second amplification transistor. One of a source and a drain of the second amplification transistor may be electrically connected to one of a source and a drain of the second selection transistor Alternatively, in the above embodiment, the second transfer transistor, the second reset transistor, the second amplification transistor, and the second selection transistor include a metal oxide in a channel formation region. The metal oxide may include an element AJ (M is Al, Ga, Y, or Sn) and Zn.

Alternatively, in the above embodiments, a period in which the imaging device obtains the first imaging data may be different from a period in which the imaging device obtains the second imaging data.

An electronic device including the imaging device of one embodiment of the present invention and a display device is also one embodiment of the present invention.

Alternatively, one embodiment of the present invention is an operation method of an imaging device including a stack of a first layer comprising a photoelectric conversion element, a second layer including a first circuit, and a third layer including a second circuit. In a first period, first imaging data which is data corresponding to an illuminance of light emitted to the photoelectric conversion element is obtained and retained in the first circuit. In a second period, second imaging data which is data corresponding to an illuminance of light emitted to the photoelectric conversion element is obtained and retained in the second circuit. In a third period, the first imaging data retained in the first circuit and the second imaging data retained in the second circuit are read out.

Alternatively, in the above embodiment, a first AD conversion circuit is provided in the second layer and a second AD conversion circuit is provided in the third layer. In the third period, the first AD conversion circuit converts the first imaging data which is analog data into digital data, and the second AD conversion circuit may convert the second imaging data which is analog data into digital data.

Alternatively, one embodiment of the present invention is an operation method of an imaging device including a stack of a photoelectric conversion element, a first circuit, and a second circuit. In a first period, first imaging data which is data corresponding to an illuminance of light emitted to the photoelectric conversion element is obtained and retained in the first circuit. In a second period, second imaging data which is data corresponding to an illuminance of light emitted to the photoelectric conversion element is obtained and retained in the second circuit. In a third period, the first imaging data retained in the first circuit is read out. In a fourth period, the second imaging data retained in the second circuit is read out.

Alternatively, in the above embodiment, the imaging device includes an AD conversion circuit in the first layer. In the third period, the AD conversion circuit converts the first imaging data which is analog data into digital data. In the fourth period, the AD conversion circuit may convert the second imaging data which is analog data into digital data.

Alternatively, in the above embodiment, the first imaging data is obtained with a global shutter mode in the first period. In the second period, the second imaging data may be obtained with the global shutter mode.

Effect of the Invention

According to one embodiment of the present invention can provide an imaging device which can obtain a plurality of imaging data in a short period. Alternatively, an imaging device that operates at high speed can be provided. Alternatively, an imaging device which can obtain imaging data corresponding to a high-resolution image can be provided. Alternatively, an imaging device which can obtain imaging data corresponding to a high-quality image can be provided. Alternatively, an imaging device with a high aperture ratio can be provided. Alternatively, a high-sensitivity imaging device can be provided. Alternatively, an imaging device with low power consumption can be provided. Alternatively, an inexpensive imaging device can be provided. Alternatively, a highly reliable imaging device can be provided. Alternatively, a novel imaging device can be provided. Alternatively, a novel semiconductor device or the like can be provided.

Alternatively, an operation method of an imaging device which can obtain a plurality of imaging data in a short period can be provided. Alternatively, an operation method of an imaging device that operates at high speed can be provided. Alternatively, an operation method of an imaging device which can obtain imaging data corresponding to a high-resolution imaging data can be provided. Alternatively, an operation method of an imaging device which can obtain imaging data corresponding to a high-quality image can be provided. Alternatively, an operation method of an imaging device with a high aperture ratio can be provided. Alternatively, an operation method of a high-sensitivity imaging device can be provided. Alternatively, an operation method of an imaging device with low power consumption can be provided. Alternatively, an operation method of an inexpensive imaging device can be provided. Alternatively, an operation method of a highly reliable imaging device can be provided. Alternatively, an operation method of a novel imaging device can be provided. Alternatively, an operation method of a novel semiconductor device or the like can be provided.

Note that the descriptions of the effects do not disturb the existence of other effects. One embodiment of the present invention does not necessarily have all the effects. Effects other than these will be apparent from the descriptions of the specification, the claims, the drawings, and the like, and effects other than these can be derived from the descriptions of the specification, the claims, the drawings, and the like.

BRIEF DESCRIPTION OF THE DRAWINGS

FIG. 18 (A1), (A2), (A3) Perspective views of a package including the imaging device. (B1), (B2), (B3) Perspective views of a module including the imaging device.

MODE FOR CARRYING OUT THE INVENTION

Figure 1:
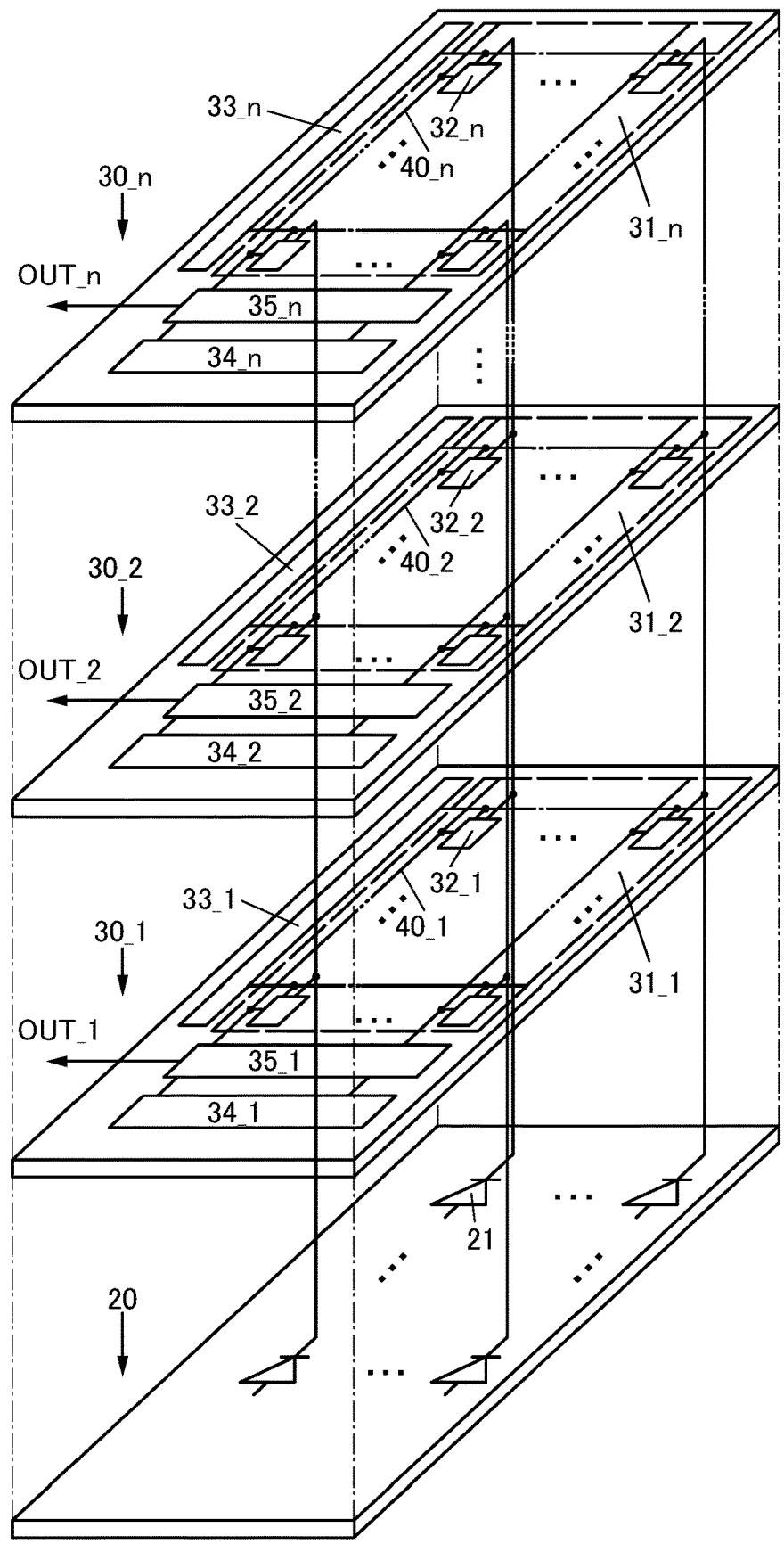
FIG. 1 A block diagram showing a structure example of an imaging device.

Embodiments will be described below with reference to the drawings. However, the embodiments can be implemented with many different modes, and it will be readily appreciated by those skilled in the art that modes and details thereof can be changed in various ways without departing from the spirit and scope thereof. Therefore, the present invention should not be construed as being limited to the description of embodiments below.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to separate actual components completely according to their functions, and it is possible for one component to relate to a plurality of functions.

In the drawings and the like, the size, the layer thickness, the region, or the like is exaggerated for clarity in some cases. Therefore, they are not limited to the illustrated scale. Note that the drawings are schematic views illustrating ideal examples, and embodiments of the present invention are not limited to shapes or values shown in the drawings.

Moreover, the same components or components having similar functions, components formed using the same material, components formed at the same time, or the like in the drawings are denoted by the same reference numerals in some cases, and the repeated description thereof is omitted in some cases.

Moreover, in this specification and the like, the term "film" and the term "layer" can be interchanged with each other. For example, the term "conductive layer" can be changed into the term "conductive film" in some cases. Alternatively, for example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer (gate terminal, gate region or gate electrode)" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, "voltage" often refers to a potential difference between a given potential and a reference potential (e.g., a ground potential). Thus, a voltage and a potential difference can be interchanged with each other.

In this specification and the like, a transistor is an element having at least three terminals including a gate, a drain, and a source. The transistor includes a channel formation region between a drain (a drain terminal, a drain region, or a drain electrode) and a source (a source terminal, a source region, or a source electrode), and current can flow between the source and the drain through the channel formation region. Note that in this specification and the like, a channel region refers to a region through which current mainly flows.

Functions of a source and a drain might be interchanged with each other when a transistor of opposite polarity is employed or when the direction of current is changed in circuit operation, for example. Thus, the terms of a source and a drain are interchangeable for use in this specification and the like.

Furthermore, unless otherwise specified, off-state current in this specification and the like refers to drain current of a transistor in an off state (also referred to as a non-conducting state or a cutoff state). Unless otherwise specified, the off state of an n-channel transistor refers to a state where voltage Vgs of a gate with respect to a source is lower than a threshold voltage Vth, and the off state of a p-channel transistor refers to a state where the voltage Vgs of a gate with respect to a source is higher than the threshold voltage Vth. That is, the off-state current of an n-channel transistor sometimes refers to a drain current at the time when the voltage Vgs of a gate with respect to a source is lower than the threshold voltage Vth.

In the above description of off-state current, the drain may be replaced with the source. That is, the off-state current sometimes refers to a source current when the transistor is in an off state. In addition, leakage current sometimes expresses the same meaning as off-state current. In this specification and the like, the off-state current sometimes refers to a current that flows between a source and a drain when a transistor is in the off state.

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is called an oxide semiconductor in some cases. That is, when a metal oxide has at least one of an amplifying function, a rectifying function, and a switching function, the metal oxide can be called a metal oxide semiconductor In other words, a transistor containing a metal oxide in a channel formation region can be referred to as an "oxide semiconductor transistor" or an "OS transistor". Similarly, the "transistor using an oxide semiconductor" described above is also a transistor containing a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, an imaging device of one embodiment of the present invention is described with reference to drawings.

One embodiment of the present invention is an imaging device including a pixel where a photoelectric conversion element and n (n is an integer more than or equal to 2) retention circuits are provided. The photoelectric conversion element and the n retention circuits are stacked with each other. One electrode of the photoelectric conversion element is electrically connected to the first to n-th retention circuits. The retention circuits have a function of retaining imaging data. The retention circuits includes an OS transistor having a characteristic of extremely low off-state current, and can retain imaging data for a long time.

In this specification and the like, imaging data is data corresponding to the illuminance of light emitted to the photoelectric conversion element. The imaging device of one embodiment of the present invention has a function of obtaining imaging data to write it to the retention circuits. The imaging device of one embodiment of the present invention also has a function of reading the imaging data out retained in the retention circuits, performing analog-to-digital conversion (hereinafter AD conversion), and outputting the imaging data outside the imaging device.

An operation method of the imaging device of one embodiment of the present invention is described below. First, in the first period, the imaging device obtains the first imaging data and writes it to the first retention circuit. Similarly, in the second to n-th periods, the imaging device obtains the second to n-th imaging data and writes them to the second to n-th retention circuits. Then, the first to n-th imaging data retained in the first to n-th retention circuits are read out. AD conversion is performed on the read imaging data and the imaging data is output outside the imaging device as described above. The above is an operation method of the imaging device of one embodiment of the present invention.

As described above, the retention circuit included in the imaging device of one embodiment of the present invention can retain the imaging data for a long time. The imaging device obtains one imaging data and writes it to the retention circuit; the imaging data is not needed to be read out immediately after writing. Rather, n imaging data (the first to n-th imaging data) are obtained, and then the imaging data can be read out. That is, n imaging data can be read out collectively. A plurality of imaging data can be obtained in a short period compared to the case where one imaging data is obtained and read out alternately. The imaging device of one embodiment of the present invention can be used for a high-speed camera, for example. In addition, when imaging data are collectively read out, n imaging data can be obtained in a short period even though the imaging data are not rapidly read out. Accordingly, a plurality of imaging data can be obtained in a short period, and the power consumption of the imaging device of one embodiment of the present invention can be reduced.

As described above, the first to n-th retention circuits of the imaging device of one embodiment of the present invention are stacked. Thus, even when n imaging data are collectively read out, imaging data corresponding to an image with the same level of resolution when imaging data is read out one by one can be obtained. Therefore, the imaging device of one embodiment of the present invention can achieve both obtaining a plurality of imaging data in a short period and obtaining imaging data corresponding to a high-resolution image.

Structure Example 1 of Imaging Device

FIG. 1 is a block diagram showing a structure example of an imaging device 10 that is the imaging device of one embodiment of the present invention. The imaging device 10 includes a layer 20 and n layers 30 (n is an integer more than or equal to 2) provided over the layer 20. That is, the layer 20 and the n layers 30 are stacked.

In this specification and the like, each of the n layers 30 is distinguished by describing each as a layer 30_1 to a layer 30_n. For example, in the n layers 30, the bottom layer 30 is described as the layer 30_1, and the layer 30_2 to the layer 30_n are provided upwards in this order. Note that in the n layers 30, the uppermost layer 30 may be described as the layer 30_1, and the layer 30_2 to the layer 30_n may be provided downwards in this order. In addition, when "_i" is added to reference numerals of components such as a circuit provided to the layer 30_i (i is an integer within the range of 1 to n), the layer 30 to which the components are provided is denoted.

Photoelectric conversion elements 21 are arranged in a matrix in the layer 20. For the photoelectric conversion elements 21, a photodiode can be used. When light is emitted to the photoelectric conversion elements 21, electric charge corresponding to the illuminance of the light is accumulated.

The layer 30 includes an imaging portion 31, a gate driver circuit 33, a source driver circuit 34, and an AD conversion circuit 35. The imaging portion 31 includes retention circuits 32 arranged in a matrix. The gate driver circuit 33 and the source driver circuit 34 can have a structure in which a shift register circuit is included, for example.

The retention circuits 32 in as many columns and rows as the photoelectric conversion elements 21 are provided to the layer 30, for example. The imaging device 10 includes n layers 30, and the retention circuits 32_n times as many as the photoelectric conversion elements 21 can be provided to the imaging device 10. The retention circuit 32 can be provided to include a region overlapping with the photoelectric conversion element 21.

In one layer 30, one gate driver circuit 33, one source driver circuit 34, and one AD conversion circuit 35 can be provided, for example. In that case, in the imaging device 10, n gate driver circuits 33, n source driver circuits 34, and n AD conversion circuits 35 are provided. Note that at least two gate driver circuits 33, at least two source driver circuits 34, and/or at least two AD conversion circuits 35 may be provided in one layer 30.

One electrode of the photoelectric conversion element 21 is electrically connected to the retention circuit 32_1 to the retention circuit 32_n. For example, the one electrode of the photoelectric conversion element 21 is electrically connected to the retention circuit 32_1 to the retention circuit 32_n which have a region overlapping with the photoelectric conversion element 21.

The gate driver circuit 33 is electrically connected to the retention circuit 32. The AD conversion circuit 35 is electrically connected to the retention circuit 32 through a wiring 40. The source driver circuit 34 is electrically connected to the AD conversion circuit 35.

The retention circuit 32_1 to the retention circuit 32_n can be provided to have a region overlapping with each other. One photoelectric conversion element 21 and the retention circuit 32_1 to the retention circuit 32_n which have a region overlapping with each other constitute one pixel.

A gate driver circuit 33_1 to a gate driver circuit 33_n can be provided to have a region overlapping with each other. A source driver circuit 34_1 to a source driver circuit 34_n can be provided to have a region overlapping with each other. An AD conversion circuit 35_1 to an AD conversion circuit 35_n can be provided to have a region overlapping with each other.

The retention circuit 32 has a function of retaining imaging data. The gate driver circuit 33 has a function of generating a selection signal for controlling the operation of the retention circuits 32. The selection signal is supplied to the retention circuits 32, so that the retention circuits 32 to which imaging data is written and the retention circuits 32 from which imaging data is read out can be selected. The gate driver circuit 33 can select the retention circuits 32 row by row.

The source driver circuit 34 has a function of selecting the retention circuits 32 from which retained imaging data is read out, for example. The source driver circuit 34 can select the retention circuits 32 column by column. Thus, the imaging data retained in the retention circuit 32 in the row selected by the gate driver circuit 33 and the column selected by the source driver circuit 34 can be read out.

The AD conversion circuit 35 has a function of converting imaging data that is analog data read out from the retention circuit 32 into digital data and outputting the digital data outside the imaging device 10 as a signal OUT. The signal OUT can be output to a display device, for example. Alternatively, the signal OUT can be output to a memory device, a communication device, or the like.

Note that the imaging data read out from the retention circuit 32 are supplied to the AD conversion circuit 35 through the wiring 40. It can be said that the wiring 40 has a function of a data line.

Structure Example of Retention Circuit

Figure 2:
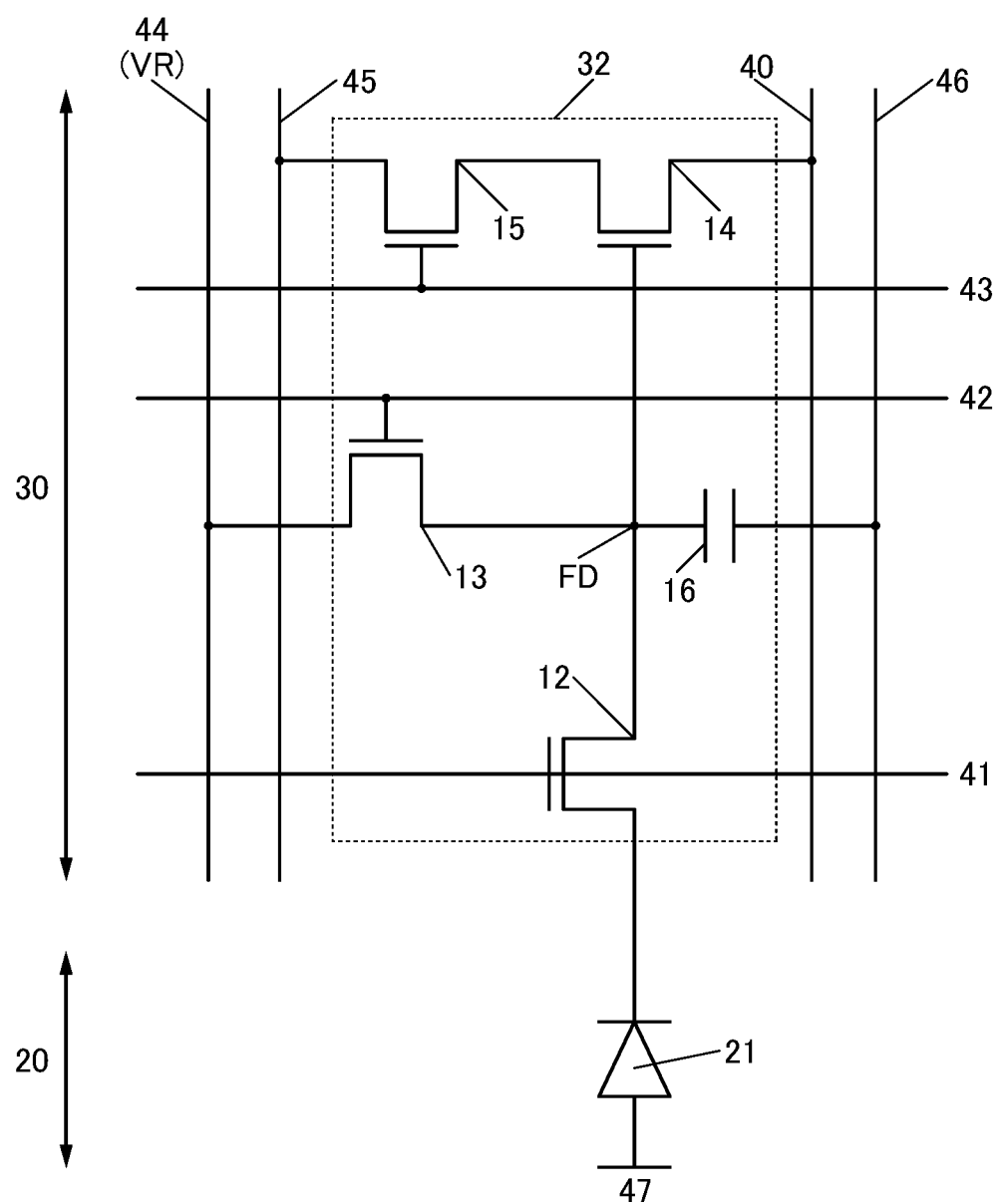
FIG. 2 A circuit diagram showing a structure example of the imaging device.

FIG. 2 is a circuit diagram showing a structure example of the retention circuit 32 and the connection relation between the photoelectric conversion element 21 and the retention circuit 32. The retention circuit 32 includes a transistor 12, a transistor 13, a transistor 14, a transistor 15, and a capacitor 16. Note that the capacitor 16 is not necessarily provided.

One electrode of the photoelectric conversion element 21 is electrically connected to one of a source and a drain of the transistor 12. The other of the source and the drain of the transistor 12 is electrically connected to one of a source and a drain of the transistor 13. The one of the source and the drain of the transistor 13 is electrically connected to a gate of the transistor 14. The gate of the transistor 14 is electrically connected to one electrode of the capacitor 16. One of a source and a drain of the transistor 14 is electrically connected to one of a source and a drain of the transistor 15. Note that although FIG. 2 shows a structure in which a cathode of the photoelectric conversion element 21 is electrically connected to the one of the source and the drain of the transistor 12 and an anode of the photoelectric conversion element 21 is electrically connected to a wiring 47, the anode of the photoelectric conversion element 21 may be electrically connected to the one of the source and the drain of the transistor 12 and the cathode of the photoelectric conversion element 21 may be electrically connected to the wiring 47.

The point where the other of the source and the drain of the transistor 12, one of a source and a drain of the transistor 13, a gate of the transistor 14, and one electrode of the capacitor 16 are connected is a node FD.

A gate of the transistor 12 is electrically connected to a wiring 41. A gate of the transistor 13 is electrically connected to the wiring 42. A gate of the transistor 15 is electrically connected to the wiring 43. The other of the source and the drain of the transistor 13 is electrically connected to a wiring 44. The other of the source and the drain of the transistor 14 is electrically connected to the wiring 40. The other of the source and the drain of the transistor 15 is electrically connected to a wiring 45. The other electrode of the capacitor 16 is electrically connected to a wiring 46. The other electrode of the photoelectric conversion element 21 is electrically connected to the wiring 47.

A wiring 41, a wiring 42, and a wiring 43 have a function of a scan line for controlling on/off of the transistor 12, the transistor 13, and the transistor 15 respectively, and are electrically connected to the gate driver circuit 33 which is not shown in FIG. 2.

A constant potential can be supplied to the wiring 44 to the wiring 47. For instance, a power supply potential can be supplied. In this case, the wiring 44 to the wiring 47 have a function of power supply lines. For example, a high potential can be supplied to the wiring 44 and the wiring 45 and a low potential can be supplied to the wiring 46 and the wiring 47. The potential supplied to the wiring 44 is a potential VR. In the case where the anode of the photoelectric conversion element 21 is electrically connected to the one of the source and the drain of the transistor 12 and the cathode of the photoelectric conversion element 21 is electrically connected to the wiring 47, a high potential can be supplied to the wiring 45 and the wiring 47, and a low potential can be supplied to the wiring 44 and the wiring 46.

In this specification and the like, a low potential can be a ground potential or a negative potential, for example. A high potential can be a potential higher than a low potential.

The transistor 12 functions as a transfer transistor which controls transfer to the node FD of the electric charge accumulated in the photoelectric conversion element 21 by exposing the photoelectric conversion element 21 to light. By turning the transistor 12 on, the electric charge accumulated in the photoelectric conversion element 21 is transferred to the node FD. Thus, the potential of the node FD is set to a potential depending on the illuminance of light emitted to the photoelectric conversion element 21, and imaging data is written to the retention circuit 32. Then, the transistor 12 is turned off, whereby imaging data written to the retention circuit 32 is retained.

The transistor 13 has a function as a reset transistor which controls resetting the potential of the node FD. When the transistor 12 and the transistor 13 are turned on before exposure of the photoelectric conversion element 21 to light is started, the electric charge accumulated in the photoelectric conversion element 21 and the node FD can be reset. Accordingly, the potential of the node FD can be reset to the potential VR, for example.

The transistor 14 has a function of an amplifier transistor that amplifies the imaging data retained in the retention circuit 32.

The transistor 15 has a function of controlling reading of imaging data retained in the retention circuit 32. When the transistor 15 is turned on, the potential of the wiring 45 is supplied to the one of the source and drain of the transistor 14, and a current depending on the potential of the node FD flows into the transistor 14. Thus, the imaging data retained in the retention circuit 32 is read out. As described above, the transistor 15 can be said to have a function of a selection transistor that selects the retention circuit 32 where imaging data is read out.

The transistor 12 and the transistor 13 are preferably transistors having an extremely low off-state current. Accordingly, the leakage of the electric charge accumulated in the node FD can be suppressed; the potential of the node FD can be held for a long time. Imaging data can be retained in the retention circuit 32 for a long time. Thus, when imaging data is written to the retention circuit 32, the imaging data need not to be read out immediately after writing.

An OS transistor can be given as an example of a transistor having an extremely low off-state current. An OS transistor is characterized by a high withstand voltage. Thus, the use of an OS transistor as the transistor 12 in particular allows a high voltage to be supplied to the photoelectric conversion element 21.

The transistor 12 to the transistor 15 are provided in the layer 30. That is, the transistor 12 to the transistor 15 can be provided in the same layer. The transistor 12 to the transistor 15 can have the same structure. For example, all the transistor 12 to the transistor 15 can be OS transistors.

Figure 3:
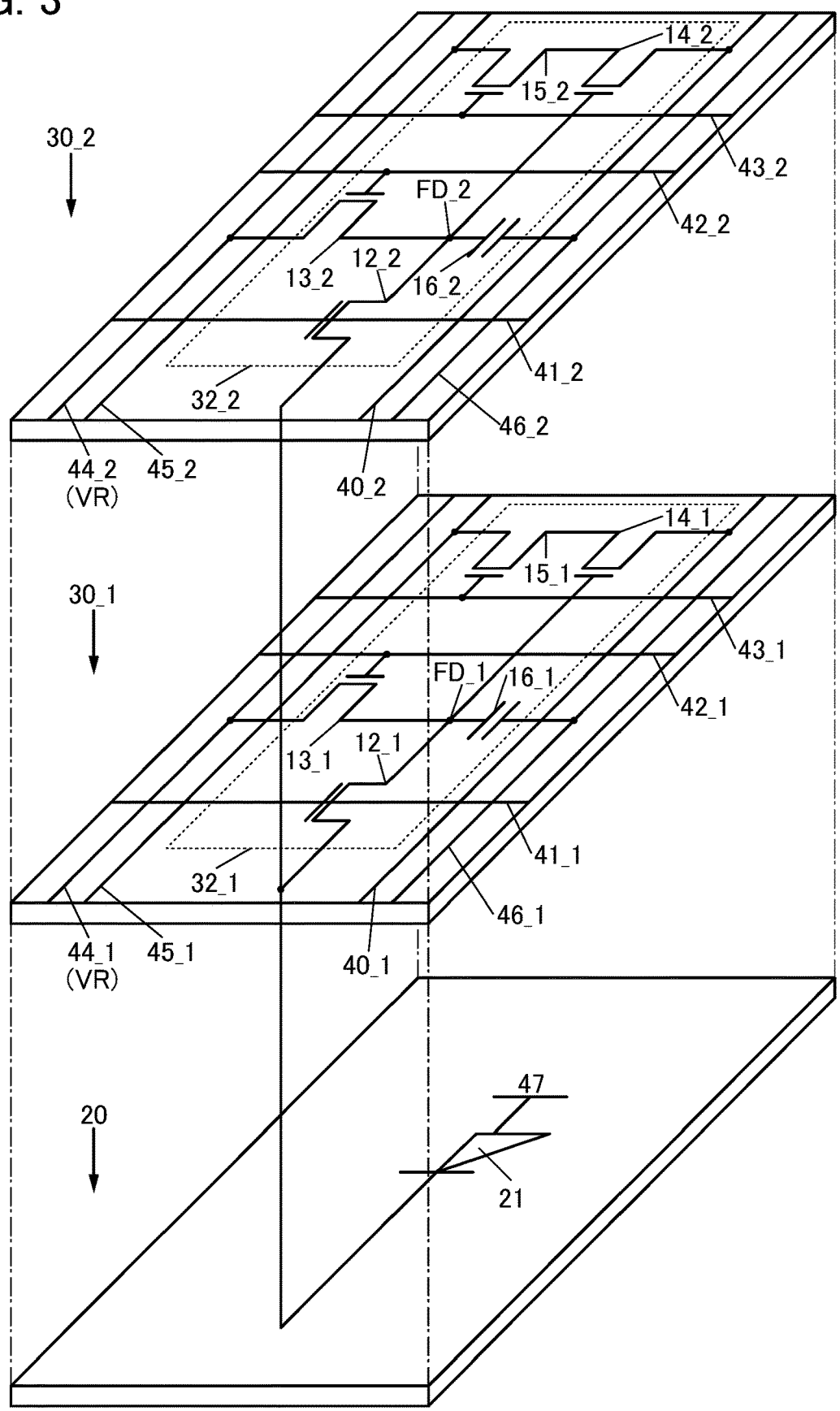
FIG. 3 A block diagram showing a structure example of the imaging device.

FIG. 3 is a diagram showing a stacked structure example of the photoelectric conversion element 21 and the retention circuits 32, and is a diagram of the structure example of the pixel included in the imaging device 10. In FIG. 3, n is 2 for clarification of the drawing and ease of the explanation thereof. That is, FIG. 3 shows the photoelectric conversion element 21, the retention circuit 32_1, and the retention circuit 32_2. Note that n may be 2 in the following drawings and the like.

As shown in FIG. 3, the retention circuit 32_1 and the retention circuit 32_2 can have a similar structure. Since the retention circuit 32_1 to the retention circuit 32_n can have a similar structure, the retention circuit 32_1 and the retention circuit 32_2 can be manufactured with the same masks. Thus, even when n is increased, an increase in the number of masks used for manufacturing the imaging device 10 can be suppressed. That is, even when the number of layers 30 is increased, an increase in the number of masks used for manufacturing the imaging device 10 can be suppressed. Thus, even when the number of layers 30 is increased, a drastic increase of manufacturing cost for the imaging device 10 can be suppressed and the imaging device 10 can be inexpensive.

Operation Method Example 1 of Imaging Device

Figure 4:
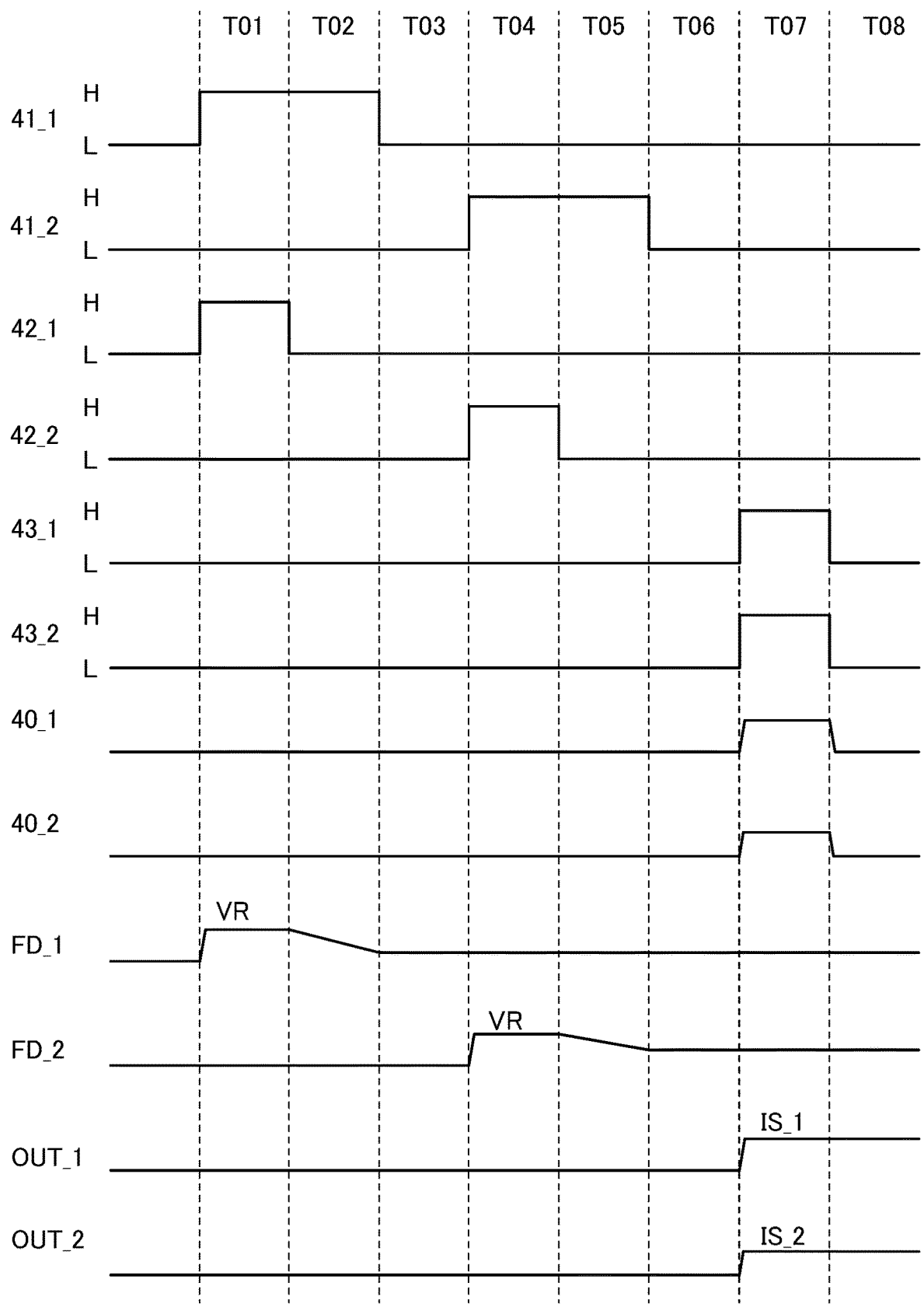
FIG. 4 A timing chart showing an example of an operation method of the imaging device.

FIG. 4 is a timing chart showing an operation method example of the imaging device 10 when a pixel has the structure shown in FIG. 3. In FIG. 4, "H" shows a high potential and "L" shows a low potential. This may apply to the other drawings.

In the operation method shown in FIG. 4, all the transistor 12 to the transistor 15 are n-channel transistors, but any or all of the transistor 12 to the transistor 15 can be p-channel transistors. Even in this case, the operation method shown in FIG. 4 can be referred to when high potentials and low potentials are interchanged appropriately.

In the period T01, the potential of a wiring 41_1 and the potential of a wiring 42_1 are set to a high potential. The potential of a wiring 41_2, the potential of a wiring 42_2, the potential of a wiring 43_1, and the potential of a wiring 43_2 are set to a low potential. This turns a transistor 12_1 and a transistor 13_1 on, and resets the electric charge accumulated in the photoelectric conversion element 21 and a node FD_1. This reset the potential of a node FD_2 to the potential VR (reset operation).

In the period T02, the potential of the wiring 42_1 is set to a low potential. This turns the transistor 13_1 off and transfers the electric charge accumulated in the photoelectric conversion element 21 depending on the illuminance of light emitted to the photoelectric conversion element 21 to the node FD_1. Thus, the potential of the node FD_1 is changed depending on the illuminance of light emitted to the photoelectric conversion element 21 (exposure operation). Accordingly, imaging data is obtained by the imaging device 10, and the imaging data is written to the retention circuit 32_1. Specifically, one imaging data is written to the retention circuit 32_1.

In this specification and the like, the imaging data written to the retention circuit 32_1 may be referred to as the first imaging data, for example.

In the period T03, the potential of the wiring 41_1 is set to a low potential. This turns the transistor 12_1 off and finishes the exposure operation, so that the potential of the node FD_1 is retained. In other words, the imaging data is retained in the retention circuit 32_1 (retention operation).

In the period T04, the potential of the wiring 41_2 and the potential of the wiring 42_2 are set to a high potential. This turns a transistor 12_2 and a transistor 13_2 on, and resets the electric charge accumulated in the photoelectric conversion element 21 and the node FD_2. This resets the potential of the node FD_2 to the potential VR (reset operation).

In the period T05, the potential of the wiring 42_2 is set to a low potential. This turns the transistor 13_2 off and transfers the electric charge accumulated in the photoelectric conversion element 21 depending on the illuminance of light emitted to the photoelectric conversion element 21 to the node FD_2. This changes the potential of the node FD_2 depending on the illuminance of light emitted to the photoelectric conversion element 21 (exposure operation). Accordingly, imaging data is obtained by the imaging device 10, and the imaging data is written to the retention circuit 32_2.

In the period T06, the potential of the wiring 41_2 is set to a low potential. This turns the transistor 12_2 off and finishes the exposure operation, so that the potential of the node FD_2 is retained. In other words, the imaging data is retained in the retention circuit 32_2 (retention operation).

In the period T07, the potential of the wiring 43_1 and the potential of the wiring 43_2 are set to a high potential. This turns a transistor 15_1 and a transistor 15_2 on, sets the potential of the wiring 40_1 to a potential corresponding to the potential of the node FD_1, and sets the potential of the wiring 40_2 to a potential corresponding to the potential of the node FD_2. In other words, the imaging data retained in the retention circuit 32_1 and the imaging data retained in the retention circuit 32_2 are read out (read operation). The imaging data read out from the retention circuit 32_1 is converted into digital data by the AD conversion circuit 35_1 and output to the outside of the imaging device 10 as a signal OUT_1. The imaging data read out from the retention circuit 32_2 is converted into digital data by the AD conversion circuit 35_2 and output outside the imaging device 10 as a signal OUT_2.

Note that in FIG. 4, the digital signal corresponding to the imaging data read out from the retention circuit 32_1 is shown as IS_1, and the digital signal corresponding to the imaging data read out from the retention circuit 32_2 is shown as IS_2. This may apply to the other drawings.

In the period T08, the potential of the wiring 43_1 and the potential of the wiring 43_2 are set to a low potential. This turns the transistor 15_1 and the transistor 15_2 off and finishes the read operation. The above is an example of the operation method of the imaging device 10.

As described above, in the period T07, the imaging data retained in the retention circuit 32_1 and the imaging data retained in the retention circuit 32_2 are read out. Accordingly, in the operation method in FIG. 4, the imaging data held in the retention circuit 32_1 and imaging data held in the retention circuit 32_2 are said to be read out at the same time.

As described above, the retention circuit 32 can retain the imaging data for a long time. Accordingly, it is unnecessary to read out the imaging data from the retention circuit 32_1 immediately after the imaging device 10 obtains one imaging data and write it to the retention circuit 32_1. Rather, the imaging data can be read out after n imaging data (n=2 in FIG. 4) are obtained. That is, the n imaging data can be read out collectively. Thus, the imaging device 10 can obtain a plurality of imaging data in a short period compared to the case where one imaging data is obtained and read out alternately. Thus, the imaging device of one embodiment of the present invention can be used for a high-speed camera, for example. In addition, when imaging data are collectively read out, n imaging data can be obtained in a short period even though the imaging data are not rapidly read out. Accordingly, a plurality of imaging data can be obtained in a short period, and the power consumption of the imaging device 10 can be reduced.

As described above, the retention circuit 32_1 to the retention circuit 32_n are stacked. Thus, even when n imaging data are collectively read out, imaging data corresponding to a similar resolution image obtained when imaging data is read out one by one can be obtained. Therefore, the imaging device 10 can achieve both obtaining a plurality of imaging data in a short period and obtaining imaging data corresponding to a high-resolution image.

Structure Example 2 of Imaging Device

Figure 5:
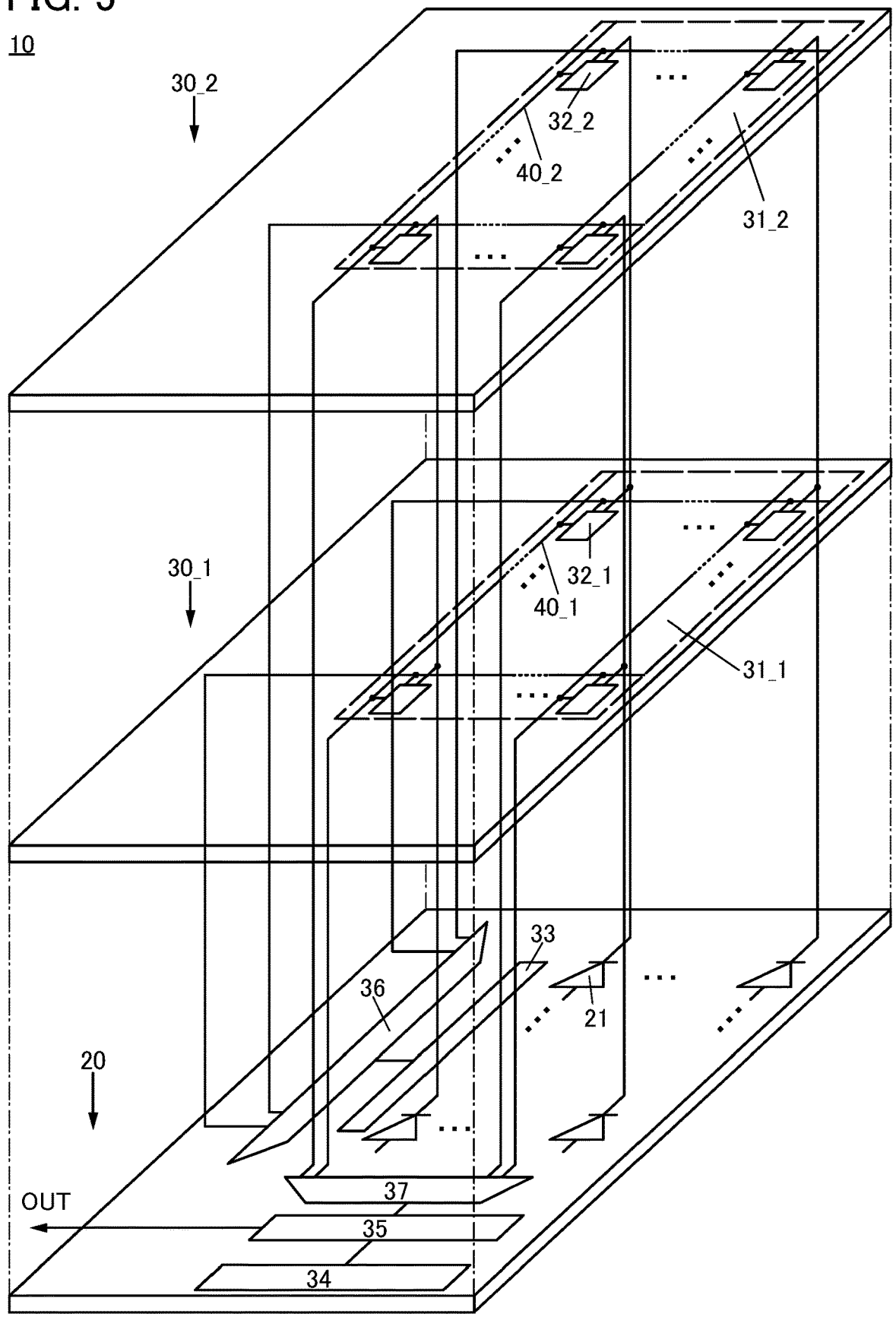
FIG. 5 A block diagram showing a structure example of the imaging device.

FIG. 5 is a block diagram showing a structure example of the imaging device 10 and a variation example of FIG. 1. In the imaging device 10 in FIG. 1, the gate driver circuit 33, the source driver circuit 34, and the AD conversion circuit 35 are provided in the layer 30. On the other hand, in the imaging device 10 in FIG. 5, the gate driver circuit 33, the source driver circuit 34, and the AD conversion circuit 35 are provided in the layer 20.

In the layer 20 of the imaging device 10 having the structure in FIG. 5, a demultiplexer circuit 36 and a multiplexer circuit 37 are provided. An input terminal of the demultiplexer circuit 36 is electrically connected to the gate driver circuit 33. Output terminals of the demultiplexer circuit 36 are electrically connected to the retention circuits 32. Specifically, the output terminals of the demultiplexer circuit 36 are electrically connected to the wiring 41 to the wiring 43 shown in FIG. 3 and other drawings. Thus, the demultiplexer circuit 36 can be said to be provided between the gate driver circuit 33 and the retention circuits 32.

Input terminals of the multiplexer circuit 37 are electrically connected to the retention circuits 32 through the wirings 40. An output terminal of the multiplexer circuit 37 is electrically connected to the AD conversion circuit 35. The multiplexer circuit 37 can be said to be provided between the retention circuit 32 and the AD conversion circuit 35.

The demultiplexer circuit 36 has a function of allocating a selection signal generated by the gate driver circuit 33 to any one of the retention circuit 32_1 to the retention circuit 32_n. The multiplexer circuit 37 has a function of selecting imaging data read out from the retention circuit 32_1 to the retention circuit 32_n to provide to the AD conversion circuit 35. Note that in FIG. 5, n is 2.

When the imaging device 10 has a structure including the demultiplexer circuit 36 and the multiplexer circuit 37, the number of gate driver circuits 33, the number of source driver circuits 34, and the number of AD conversion circuits 35 can be smaller than n. For example, as shown in FIG. 5, one gate driver circuit 33, one source driver circuit 34, and one AD conversion circuit 35 can be provided in the layer 20. Note that at least two gate driver circuits 33, at least two source driver circuits 34, and/or at least two AD conversion circuits 35 may be provided in the layer 20.

The number of gate driver circuits 33, the number of source driver circuits 34, and the number of AD conversion circuits 35 included in the imaging device 10 are reduced, whereby the imaging device 10 can have low power consumption.

Note that any of the gate driver circuit 33, the source driver circuit 34, and the AD conversion circuit 35 may be provided in the layer 30. For example, the gate driver circuit 33 may be provided in the layer 30, and the source driver circuit 34 and the AD conversion circuit 35 may be provided in the layer 20. In that case, the demultiplexer circuit 36 is not needed to be provided in the imaging device 10.

Operation Method Example 2 of Imaging Device

Figure 6:
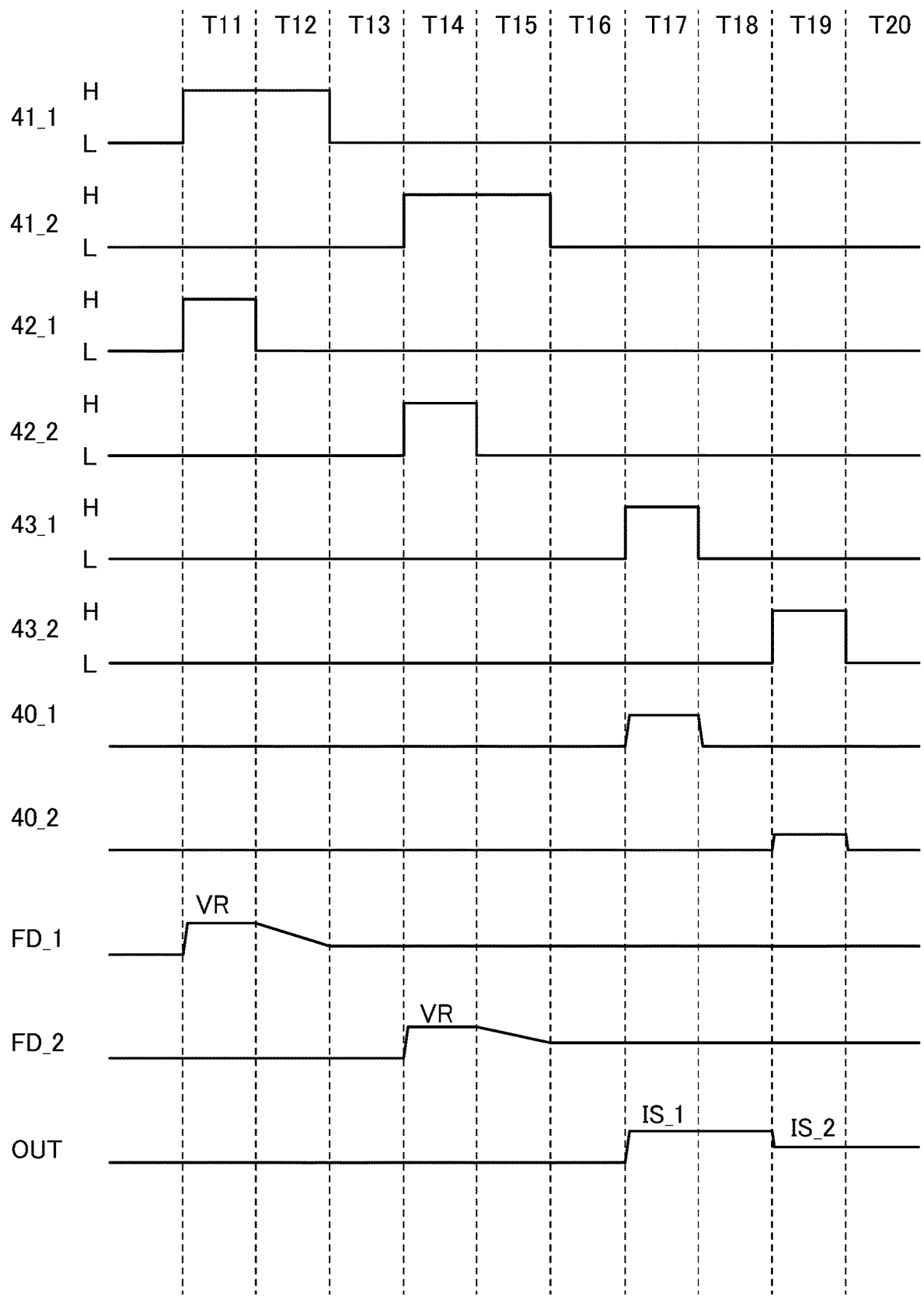
FIG. 6 A timing chart showing an example of an operation method of the imaging device.

FIG. 6 is a timing chart showing an operation method example of the imaging device 10 in the case where the pixel has the structure shown in FIG. 3 and the imaging device 10 has the structure shown in FIG. 5. Here, the operations within the period T11 to the period T16 in FIG. 6 are the same as the operations within the period T01 to the period T06 in FIG. 4.

In the period T17, the potential of the wiring 43_1 is set to a high potential. This turns the transistor 15_1 on and sets the potential of the wiring 40_1 to the potential corresponding to the potential of the node FD_1. In other words, the imaging data retained in the retention circuit 32_1 is read out (read operation). The imaging data read out from the retention circuit 32_1 is supplied to the AD conversion circuit 35 through the multiplexer circuit 37 and converted into digital data by the AD conversion circuit 35. The digital data is output as the signal OUT outside the imaging device 10. That is, the signal IS_1 is output outside the imaging device 10 from the AD conversion circuit 35.

In the period T18, the potential of the wiring 43_1 is set to a low potential. This turns the transistor 15_1 off and finishes the read operation of the imaging data retained in the retention circuit 32_1.

In the period T19, the potential of the wiring 43_2 is set to a high potential. This turns the transistor 15_2 on and sets the potential of the wiring 40_2 to the potential corresponding to the potential of the node FD_2. In other words, the imaging data retained in the retention circuit 32_2 is read out (read operation). The imaging data read out from the retention circuit 32_2 is supplied to the AD conversion circuit 35 through the multiplexer circuit 37 and converted into digital data by the AD conversion circuit 35. The digital data is output as the signal OUT outside the imaging device 10. That is, the signal IS_2 is output outside the imaging device 10 from the AD conversion circuit 35.

In the period T20, the potential of the wiring 43_2 is set to a low potential. This turns the transistor 152 off and finishes the read operation of the imaging data retained in the retention circuit 32_2. The above is an example of the operation method of the imaging device 10.

As described above, in the period T17, the imaging data retained in the retention circuit 32_1 is read out and in the period T18, the imaging data retained in the retention circuit 32_2 is read out. Accordingly, in the operation method in FIG. 6, the imaging data held in the retention circuit 32_1 and the imaging data held in the retention circuit 32_2 are said to be sequentially read out.

The operation method shown in FIG. 6 takes more time to read out imaging data than the case of reading out imaging data at the same time as shown in FIG. 4 because imaging data are sequentially read out. However, in the operation method in FIG. 6, imaging data can be read out after n imaging data are obtained as in the operation method shown in FIG. 4. Thus, even when the imaging device 10 is operated with the operation method shown in FIG. 6, the imaging device 10 can obtain a plurality of imaging data in a short period as in the case where the imaging device 10 is operated with the operation method shown in FIG. 4.

As described above, the retention circuit 32 can retain imaging data for a long time. Therefore, even when imaging data are sequentially read out, image quality corresponding to the imaging data which are read out is inhibited from decreasing than that when imaging data are collectively read out.

Structure Example 3 of Imaging Device

Figure 7:
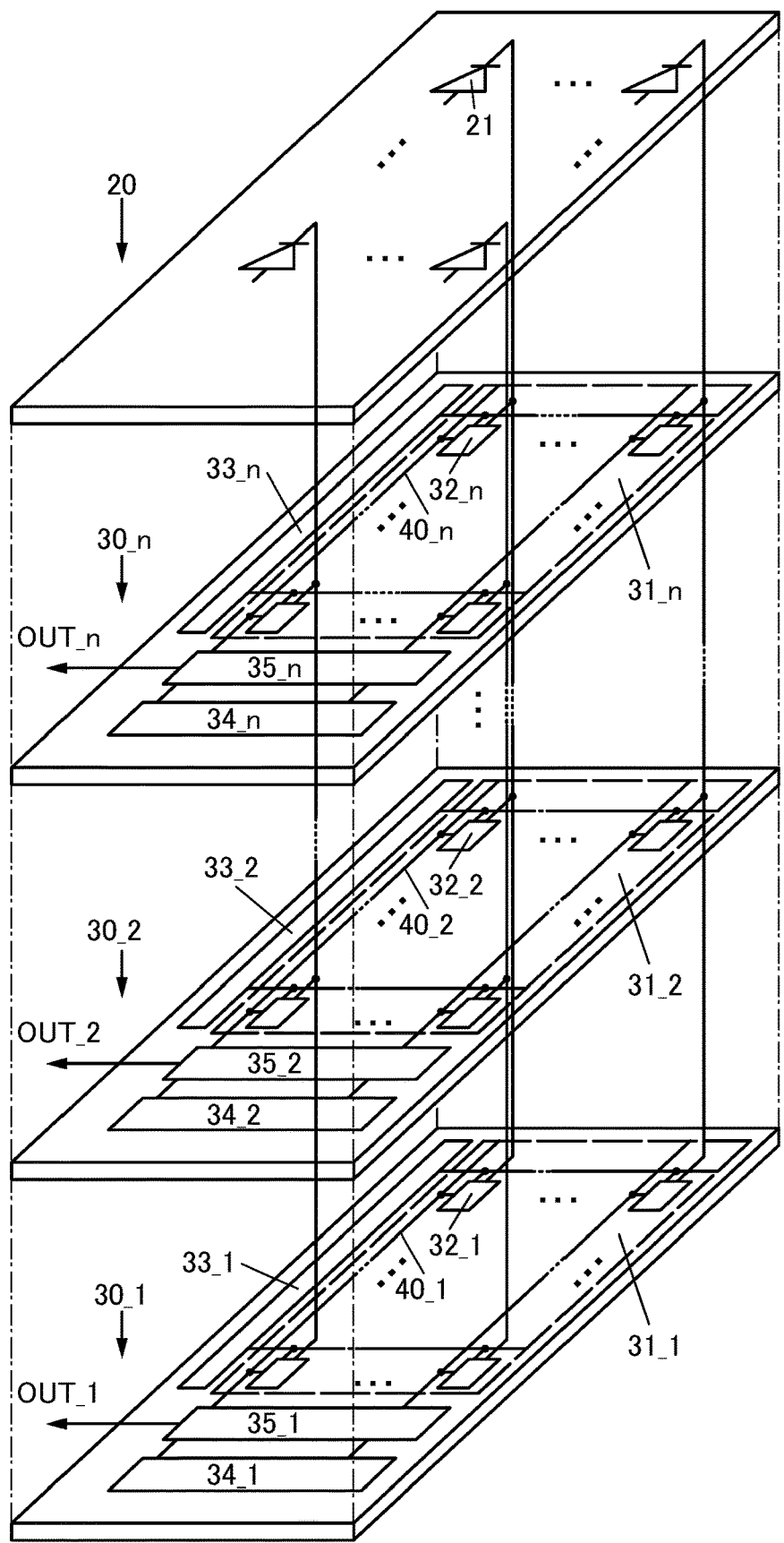
FIG. 7 A block diagram showing a structure example of the imaging device.

FIG. 7 is a block diagram showing a structure example of an imaging device 10 and a variation example of FIG. 1. The imaging device 10 in FIG. 1 includes the layers 30 including the retention circuits 32 over the layer 20 including the photoelectric conversion element 21. On the other hand, the imaging device 10 in FIG. 7 includes the layers 30 including the retention circuits 32 under the layer 20, which is different from the structure in FIG. 1.

Operation Mode of Imaging Device

Figure 8A:
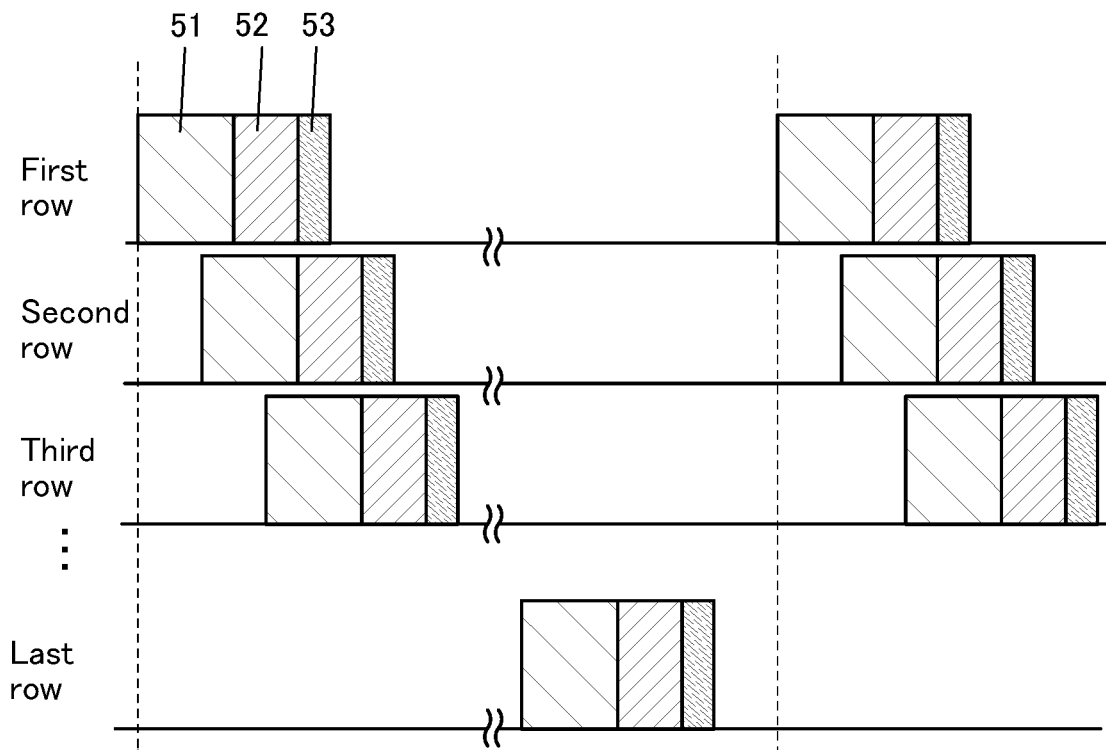
FIG. 8 (A), (B) Diagrams showing operations of a rolling shutter-mode and a global shutter mode.
Figure 8B:
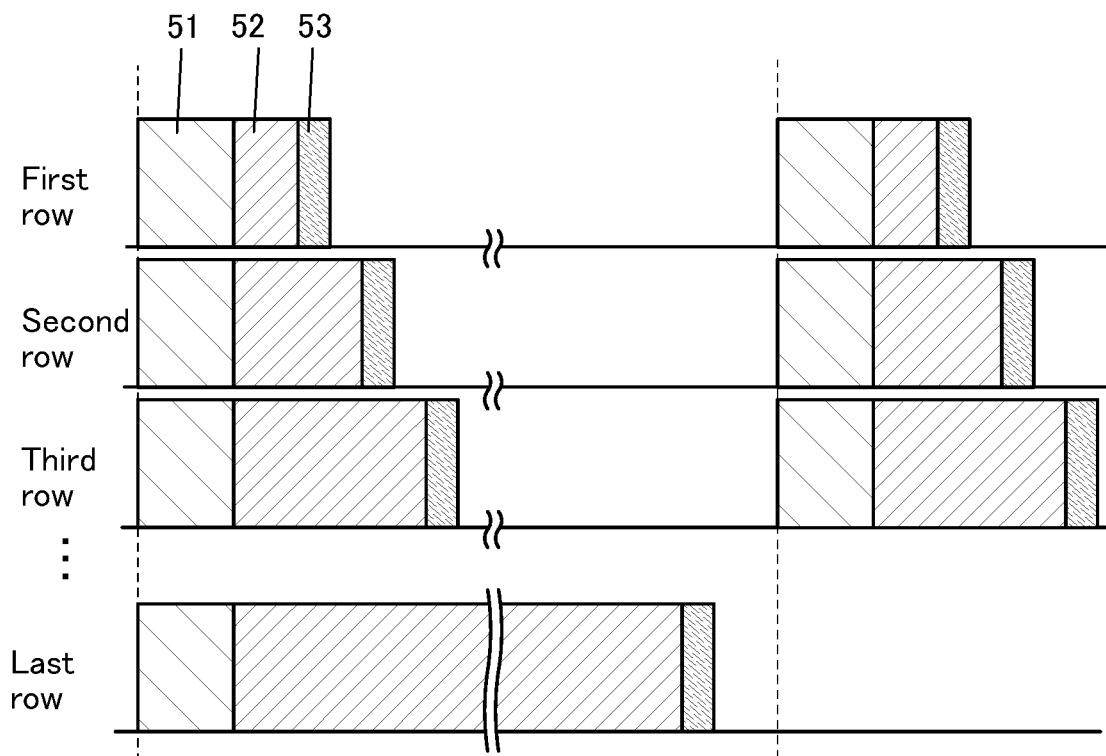

FIGS. 8(A) and 8(B) are diagrams showing operation methods of the retention circuits 32_i (i is an integer within the range of 1 to n) arranged in a matrix in the imaging device 10. In other words, FIGS. 8(A) and 3(B) are diagrams showing operation methods of the retention circuits 32 when the retention circuit 32 arranged in a matrix in one layer 30 are focused.

FIG. 8(A) is a diagram showing a rolling shutter mode and an exposure operation 51, a retention operation 52, and a read operation 53 are performed on the retention circuits 32_i row by row. FIG. 8(B) is a diagram showing a global shutter mode; the exposure operation 51 is concurrently performed on all the retention circuits 32_i in all rows and the read operation 53 is sequentially performed row by row. When a rolling shutter mode is employed, an image is distorted when an object moves since simultaneousness of imaging is lost. On the other hand, when a global shutter mode is employed, an image with few distortions can be easily obtained even though an object moves since simultaneousness of imaging is secured. Thus, the imaging device 10 can obtain imaging data corresponding to a high-quality image through the use of the global shutter mode.

In contrast, the larger the row number of the retention circuits 32_i becomes, the longer the period of the retention operation 52 becomes when a global shutter mode is employed, as shown in FIG. 8(B). However, as described above, when the retention circuits 32 have a structure including a transistor with extremely low off-state current such as an OS transistor, the retention circuits 32 can retain imaging data for a long time. Therefore, a global shutter mode can be employed. In the above manner, imaging data corresponding to a high-quality image can be obtained by the imaging device 10.

Structure Example 1 of Pixel

Figure 9:
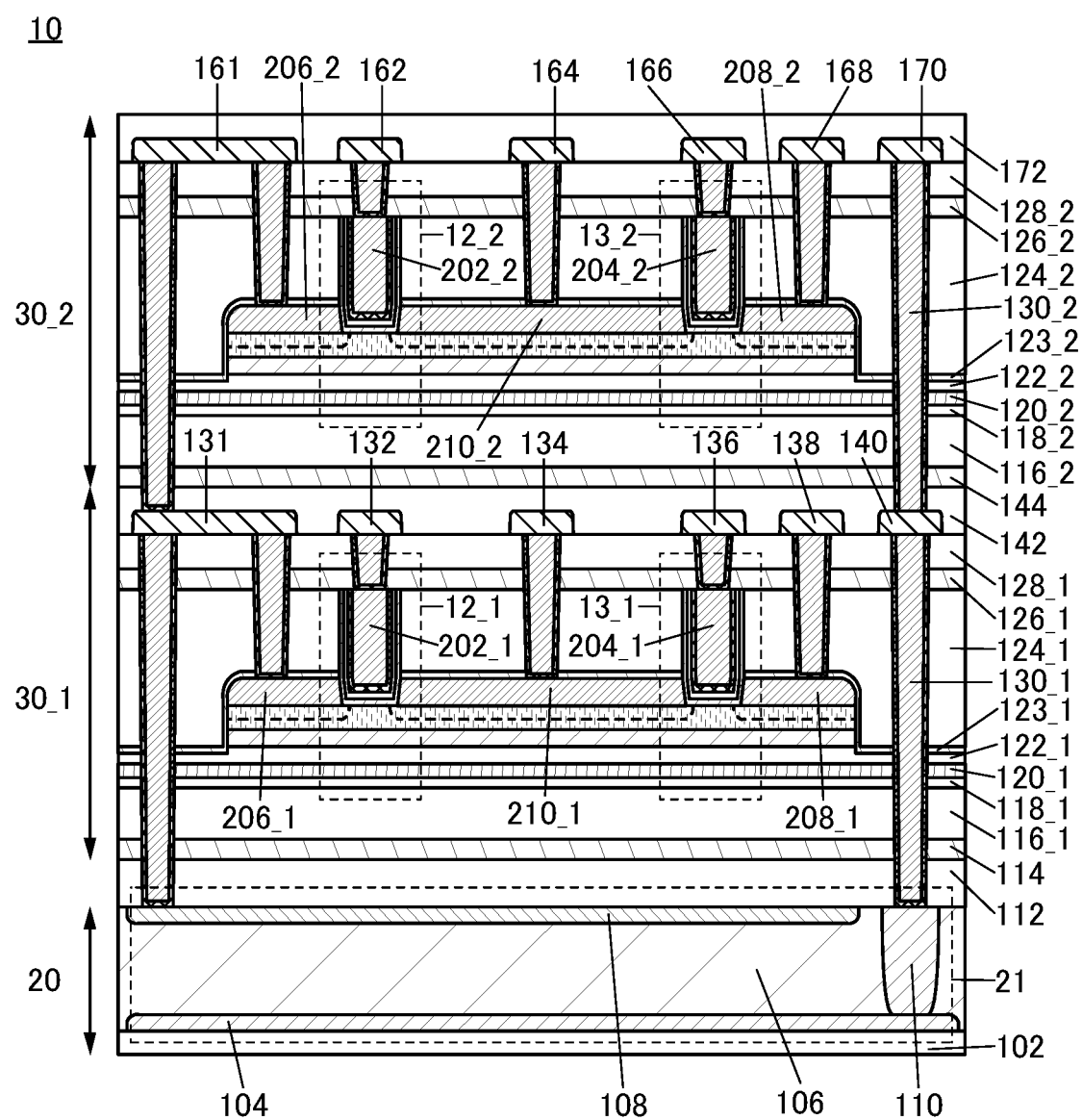
FIG. 9 A cross-sectional view showing a structure example of the imaging device.

FIG. 9 is a diagram showing a specific structure example of a pixel included in the imaging device 10 and shows a cross-sectional structure example of the photoelectric conversion element 21 and cross-sectional structure examples of the transistor 12_1, the transistor 13_1, the transistor 12_2, and the transistor 13_2 in the channel length direction. Here, in FIG. 9, the transistor 12 and the transistor 13 are OS transistors. In some cases, some of the conductive layers, insulating layers, and the like shown in the drawing is not provided, or conductive layers, insulating layers, and the like that are not shown in the drawing are included in each layer.

In FIG. 9, the layers 30 are provided over the layer 20. Thus, the structure in FIG. 9 can be used in, for example, the imaging device 10 having the structure in FIG. 1.

In the pixel having the structure shown in FIG. 9, the photoelectric conversion element 21 is provided over an insulating layer 102. The insulating layer 102 can be formed using, for example, silicon oxide, silicon oxynitride, silicon nitride oxide, silicon nitride, aluminum oxide, aluminum oxynitride, aluminum nitride oxide, or aluminum nitride. Note that the same material as the insulating layer 102 can be used for other insulating layers in FIG. 9.

A two-terminal photodiode can be used for the photoelectric conversion element 21, for example. As the photodiode, a pn-type photodiode using single crystal silicon, a pin-type photodiode using an amorphous silicon thin film, a microcrystalline silicon thin film, or a polycrystalline silicon thin film, a photodiode using selenium, a selenium compound, or an organic compound, or the like can be used.

FIG. 9 shows a structure example in which the photoelectric conversion element 21 is a pn photodiode using a single crystal silicon substrate. The photoelectric conversion element 21 having a structure shown in FIG. 9 can include a region 104, a region 106, a region 108, and a region 110. For example, the region 104 can be a p+ region, the region 106 can be a p– region, the region 108 can be an n region, and the region 110 can be a p+ region.

An insulating layer 112 is provided over the photoelectric conversion element 21, and an insulating layer 114 is provided over the insulating layer 112. The insulating layer 112 can have a function of a planarization film, for eliminating level differences caused by the photoelectric conversion element 21 and the like provided in the underlying surface. For example, the top surface of the insulating layer 112 may be planarized by planarization treatment using a chemical mechanical polishing (CMP) method or the like to improve planarity.

The insulating layer 114 is preferably formed using a film having a barrier property that prevents diffusion of impurities such as hydrogen from the photoelectric conversion element 21 and the like to the transistor 12_1 to the transistor 15_1 and the like which are provided in the retention circuit 32_1. Note that the transistor 14_1 and the transistor 15_1 are not shown in FIG. 9.

As an example of the film having a barrier property against hydrogen, silicon nitride formed by, for example, a chemical vapor deposition (CVD) method can be given. Diffusion of hydrogen into an OS transistor that can be used as the transistor 12 and the transistor 13 may degrade the performance of the OS transistor. A film that inhibits hydrogen diffusion is preferably provided between the photoelectric conversion element 21 and the transistors 12_1 and 13_1. The film that inhibits hydrogen diffusion is specifically a film from which a small amount of hydrogen is released.

The amount of released hydrogen can be measured by thermal desorption spectroscopy (TDS), for example. The amount of hydrogen released from the insulating layer 114 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

An insulating layer 116_1 is provided over the insulating layer 114, and the transistor 12_1 and the transistor 13_1 are provided over the insulating layer 116_1.

Figure 10A:
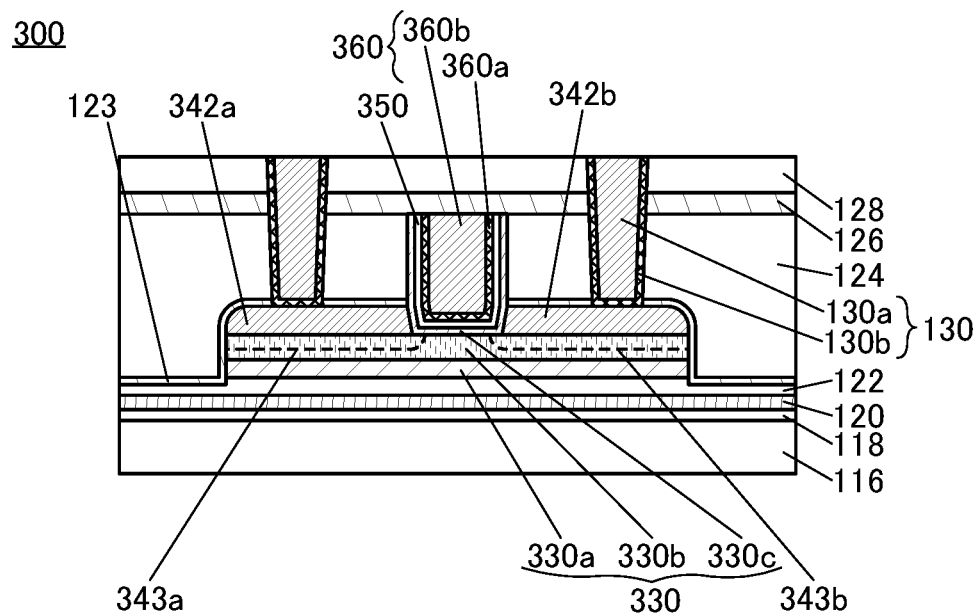
FIG. 10 (A), (B) Cross-sectional views showing a structure example of a transistor.
Figure 10B:
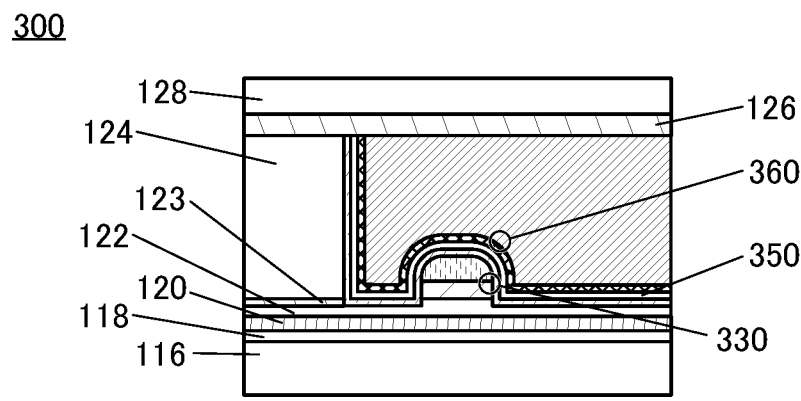

FIG. 10(A) is a cross-sectional view of a transistor 300 in the channel length direction that can be used as the transistor 12 and the transistor 13, and FIG. 10(B) is a cross-sectional view of the transistor 300 in the channel width direction. The transistor 300 includes an insulating layer 118 over an insulating layer 116, an insulating layer 120 over the insulating layer 118, an insulating layer 122 over the insulating layer 120, a metal oxide 330a over the insulating layer 122, a metal oxide 330b over the metal oxide 330a, a conductive layer 342a and a conductive layer 342b separately provided from each other over the metal oxide 330b, an insulating layer 124 over the insulating layer 342a and the insulating layer 342b in which an opening is formed overlapping with the region between the conductive layer 342a and the conductive layer 342b, a conductive layer 360 in the opening, an insulating layer 350 between the conductive layer 360 and the metal oxide 330b, the conductive layer 342a, the conductive layer 342b, and the insulating layer 124, and a metal oxide 330c between the conductive layer 350 and the metal oxide 330b, the conductive layer 342a, the conductive layer 342b, and the insulating layer 124.

As shown in FIGS. 10(A) and 10(B), an insulating layer 123 is preferably positioned between the insulating layer 124 and the metal oxide 330a, the metal oxide 330b, the conductive layer 342a, and the conductive layer 342b. As shown in FIGS. 10(A) and 10(B), the conductive layer 360 preferably includes a conductive layer 360a provided inside the insulating layer 350 and a conductive layer 360b embedded in the conductive layer 360a. As shown in FIGS. 10(A) and 10(B), an insulating layer 126 is preferably positioned over the insulating layer 124, the conductive layer 360, and the insulating layer 350.

Hereinafter, the metal oxide 330a, the metal oxide 330b, and the metal oxide 330c may be collectively referred to as a metal oxide 330. The conductive layer 342a and the conductive layer 342b may be collectively referred to as a conductive layer 342 in some cases.

The transistor 300 has a structure in which three layers of the metal oxide 330a, the metal oxide 330b, and the metal oxide 330c are stacked in the region where the channel is formed and its vicinity; however, the present invention is not limited thereto. For example, a single layer of the metal oxide 330b, a two-layer structure of the metal oxide 330b and the metal oxide 330a, a two-layer structure of the metal oxide 330b and the metal oxide 330c, or a stacked-layer structure of four or more layers may be provided. Although the transistor 300 has a structure in which the conductive layer 360 has a stacked-layer structure of two layers, the present invention is not limited thereto. For example, the conductive layer 360 may have a single-layer structure or a stacked-layer structure of three or more layers. Note that the transistor 300 shown in FIGS. 10(A) and 10(B) is an example, and the structure is not limited thereto; an appropriate transistor can be used in accordance with a circuit structure or a driving method.

The conductive layer 360 has a function of a gate of the transistor 300. The conductive layer 342a has a function of one of a source and a drain of the transistor 300, and the conductive layer 342b has a function of the other of the source and the drain of the transistor 300. As described above, the conductive layer 360 is formed to fill in the opening of the insulating layer 124 and the region between the conductive layer 342a and the conductive layer 342b. The positions of the conductive layer 360, the conductive layer 342a, and the conductive layer 342b are selected in a self-aligned manner with respect to the opening of the insulating layer 124. That is, in the transistor 300, the gate can be positioned between the source and the drain in a self-aligned manner Therefore, the conductive layer 360 can be formed without an alignment margin, resulting in a reduction in the area occupied by the transistor 300. Accordingly, miniaturization and high integration of the imaging device can be achieved.

In addition, since the conductive layer 360 is formed in the region between the conductive layer 342a and the conductive layer 342b in a self-aligned manner, the conductive layer 360 does not have a region overlapping with the conductive layer 342a or the conductive layer 342b. Thus, parasitic capacitance formed between the conductive layer 360 and each of the conductive layer 342a and the conductive layer 342b can be reduced. This improves the switching speed of the transistor 300, whereby the frequency characteristics of one embodiment of the present invention can be improved.

The insulating layer 350 has a function of a gate insulating film.

Here, as the insulating layer 122 in contact with the metal oxide 330, an insulator that contains oxygen more than oxygen in the stoichiometric composition is preferably used. That is, an excess-oxygen region is preferably formed in the insulating layer 122. When such an insulator containing excess oxygen is provided in contact with the metal oxide 330, oxygen vacancies in the metal oxide 330 can be reduced and the reliability of the transistor 300 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS analysis. Note that the temperature of the film surface in the TDS analysis is preferably within the range of 100° C. to 700° C., or within the range of 100° C. to 400° C.

In the case where the insulating layer 122 includes an excess-oxygen region, the insulating layer 120 preferably has a function of inhibiting diffusion of oxygen (e.g., an oxygen atom or an oxygen molecule) (or the insulating layer 122 is less likely to transmit oxygen).

When the insulating layer 120 has a function of inhibiting diffusion of oxygen or impurities, oxygen contained in the metal oxide 330 is not diffused to the insulating layer 118 side, which is preferable.

For example, the insulating layer 120 is preferably formed using a single layer or stacked layers of an insulator containing what is called a high-k material such as aluminum oxide, hafnium oxide, tantalum oxide, zirconium oxide, lead zirconate titanate (PZT), strontium titanate (SrTiOA), or (Ba,Sr)TiO$_3$ (BST). As miniaturization and high integration of transistors progress, a problem such as generation of leakage current may arise because of a thinner gate insulating film. When a high-k material is used for an insulator functioning as the gate insulating film, a gate potential during operation of the transistor can be reduced while the physical thickness is maintained.

It is particularly preferable to use an insulator containing an oxide of one or both of aluminum and hafnium, which is an insulating material having a function of inhibiting diffusion of impurities, oxygen, and the like (the oxygen is less likely to pass). Note that as the insulator containing an oxide of aluminum and/or hafnium, aluminum oxide, hafnium oxide, an oxide containing aluminum and hafnium (hafnium aluminate), or the like is preferably used. When the insulating layer 120 is formed using such a material, the insulating layer 120 functions as a layer that inhibits release of oxygen from the metal oxide 330 and mixing of impurities such as hydrogen from the periphery of the transistor 300 to the metal oxide 330.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

It is preferable that the insulating layer 118 be thermally stable. For example, silicon oxide and silicon oxynitride, which have thermal stability, are suitable. Furthermore, combination of an insulator which is a high-k material and silicon oxide or silicon oxynitride enables formation of the insulating layer 118 with a stacked-layer structure with thermal stability and a high dielectric constant.

Note that the insulating layer 118, the insulating layer 120, and the insulating layer 122 may each have a stacked-layer structure of two or more layers. In that case, not limited to a stacked-layer structure formed of the same material, a stacked-layer structure formed of different materials may be employed.

In the transistor 300, a metal oxide which functioning as an oxide semiconductor is preferably used as the metal oxide 330 including a channel formation region. For example, as the metal oxide 330, a metal oxide such as an In-M-Zn oxide (an element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. An In—Ga oxide or an In—Zn oxide may be used for the metal oxide 330.

The metal oxide functioning as the channel formation region in the metal oxide 330 has a band gap of preferably 2 eV or higher, further preferably 2.5 eV or higher. With the use of a metal oxide having such a wide band gap, the off-state current of the transistor can be reduced.

When the metal oxide 330 includes the metal oxide 330a under the metal oxide 330b, it is possible to inhibit diffusion of impurities into the metal oxide 330b from the components formed below the metal oxide 330a. The metal oxide 330c over the metal oxide 330b can inhibit diffusion of impurities into the metal oxide 330b from the components formed above the metal oxide 330c.

Note that the metal oxide 330 preferably has a stacked-layer structure of metal oxides with different atomic ratios of metal atoms. Specifically, the atomic ratio of the element M to the constituent elements in the metal oxide used as the metal oxide 330a is preferably higher than that in the metal oxide used as the metal oxide 330b. The atomic ratio of the element M to In in the metal oxide used as the metal oxide 330a is preferably higher than that in the metal oxide used as the metal oxide 330b. The atomic ratio of In to the element M in the metal oxide used as the metal oxide 330b is preferably higher than that in the metal oxide used as the metal oxide 330a. The metal oxide 330c can be formed using a metal oxide that can be used as the metal oxide 330a or the metal oxide 330b.

The energy of the conduction band minimum of each of the metal oxide 330a and the metal oxide 330c is preferably higher than that of the metal oxide 330b. In other words, the electron affinity of each of the metal oxide 330a and the metal oxide 330c is preferably smaller than that of the metal oxide 330b.

Here, the energy level of the conduction band minimum is gradually varied at a junction portion of each of the metal oxide 330a, the metal oxide 330b, and the metal oxide 330c. In other words, the energy levels of the conduction band minimum at a junction portion of each of the metal oxide 330a, the metal oxide 330b, and the metal oxide 330c continuously vary or are continuously connected. This can be achieved by decrease in the density of defect states in a mixed layer formed at the interface between the metal oxide 330a and the metal oxide 330b and the interface between the metal oxide 330b and the metal oxide 330c.

Specifically, when the metal oxide 330a and the metal oxide 330b or the metal oxide 330b and the metal oxide 330c contain the same element (as a main component) in addition to oxygen, a mixed layer with a low density of defect states can be formed. For example, in the case where the metal oxide 330b is an In—Ga—Zn oxide, it is preferable to use an In—Ga—Zn oxide, a Ga—Zn oxide, gallium oxide, or the like as each of the metal oxide 330a and the metal oxide 330c.

At this time, the metal oxide 330b serves as a main carrier path. When the metal oxide 330a and the metal oxide 330c have the above structure, the density of defect states at the interface between the metal oxide 330a and the metal oxide 330b and the interface between the metal oxide 330b and the metal oxide 330c can be made low. Thus, the influence of interface scattering on carrier conduction is small, and the transistor 300 can have a high on-state current.

The conductive layer 342a having a function of one of the source and the drain and the conductive layer 342b having a function of the other of the source and the drain are provided over the metal oxide 330b.

For the conductive layer 342, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As shown in FIG. 10(A), a region 343 (a region 343a and a region 343b) is sometimes formed as a low-resistance region at and near the interface between the metal oxide 330 and the conductive layer 342. In that case, the region 343a functions as one of a source region and a drain region, and the region 343b functions as the other of the source region and the drain region. The channel formation region is formed in a region between the region 343a and the region 343b.

When the conductive layer 342 is provided in contact with the metal oxide 330, the oxygen concentration in the region 343 sometimes decreases. In addition, a metal compound layer that contains the metal contained in the conductive layer 342 and the component of the metal oxide 330 is sometimes formed in the region 343. In such a case, the carrier density of the region 343 increases, and the region 343 becomes a low-resistance region.

The insulating layer 123 is provided to cover the conductive layer 342 and inhibits oxidation of the conductive layer 342. At this time, the insulating layer 123 may be provided to cover a side surface of the metal oxide 330 and to be in contact with the insulating layer 122.

A metal oxide containing one or more kinds selected from hafnium, aluminum, gallium, yttrium, zirconium, tungsten, titanium, tantalum, nickel, germanium, magnesium, and the like can be used as the insulating layer 123.

For the insulating layer 123, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulating layer 123 is not an essential component when the conductive layer 342 is an oxidation-resistant material or does not significantly lose its conductivity even after absorbing oxygen. Design is appropriately determined in consideration of required transistor characteristics.

The insulating layer 350 has a function of a gate insulating film. The insulating layer 350 is preferably positioned in contact with the inner side (the top surface and the side surface) of the metal oxide 330c. The insulating layer 350 is preferably formed using an insulator from which oxygen is released by heating. An oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy analysis (TDS analysis) is used, for example. Note that the temperature of the film surface in the TDS analysis is preferably within the range of 100° C. to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided as the insulating layer 350 in contact with the top surface of the metal oxide 330c, oxygen can be efficiently supplied from the insulating layer 350 to the channel formation region of the metal oxide 330b through the metal oxide 330c. Furthermore, as in the insulating layer 122, the concentration of impurities such as water and hydrogen in the insulating layer 350 is preferably reduced. The thickness of the insulating layer 350 is preferably within the range of 1 nm to 20 nm.

To efficiently supply excess oxygen in the insulating layer 350 to the metal oxide 330, a metal oxide may be provided between the insulating layer 350 and the conductive layer 360. The metal oxide preferably inhibits diffusion of oxygen from the insulating layer 350 to the conductive layer 360. Providing the metal oxide that inhibits diffusion of oxygen inhibits diffusion of excess oxygen from the insulating layer 350 to the conductive layer 360. That is, the reduction in the amount of excess oxygen supplied to the metal oxide 330 can be inhibited. Moreover, oxidization of the conductive layer 360 due to excess oxygen can be inhibited. For the metal oxide, a material that can be used for the insulating layer 123 is used.

Although the conductive layer 360 functioning as a gate electrode has a two-layer structure in FIGS. 10(A) and 10(B), a single-layer structure or a stacked-layer structure of three or more layers may be employed.

For the conductive layer 360a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, the conductive layer 360a is preferably formed using a conductive material having a function of inhibiting diffusion of oxygen (e.g., at least one of oxygen atoms and oxygen molecules). When the conductive layer 360a has a function of inhibiting oxygen diffusion, it is possible to prevent a reduction in conductivity of the conductive layer 360b due to oxidation caused by oxygen contained in the insulating layer 350. As a conductive material having a function of inhibiting oxygen diffusion, tantalum, tantalum nitride, ruthenium, or ruthenium oxide is preferably used, for example.

The conductive layer 360b is preferably formed using a conductive material containing tungsten, copper, or aluminum as its main component. The conductive layer 360b functions as a wiring and thus a conductor having high conductivity is preferably used. For example, a conductive material containing tungsten, copper, or aluminum as its main component can be used. The conductive layer 360b may have a stacked-layer structure, for example, a stacked-layer structure of any of the above conductive materials and titanium or titanium nitride.

The insulating layer 124 is provided over the conductive layer 342 with the insulating layer 123 therebetween. The insulating layer 124 preferably includes an excess oxygen region. For example, the insulating layer 124 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride are particularly preferable in terms of high thermal stability. In particular, silicon oxide and porous silicon oxide, in which an excess-oxygen region can be easily formed in a later step, are preferable.

The insulating layer 124 preferably includes an excess oxygen region. When the insulating layer 124 from which oxygen is released by heating is provided in contact with the metal oxide 330c, oxygen in the insulating layer 124 can be efficiently supplied to the metal oxide 330b through the metal oxide 330c. The concentration of impurities such as water or hydrogen in the insulating layer 124 is preferably lowered.

The opening of the insulating layer 124 is formed to overlap a region between the conductive layer 342a and the conductive layer 342b. Accordingly, the conductive layer 360 is formed to fill in the opening of the insulating layer 124 and the region between the conductive layer 342a and the conductive layer 342b.

The gate length needs to be short for miniaturization of the imaging device, but it is necessary to prevent a reduction in conductivity of the conductive layer 360. When the conductive layer 360 is made thick to achieve this, the conductive layer 360 might have a shape with a high aspect ratio. In this embodiment, the conductive layer 360 is provided to fill in the opening of the insulating layer 124; hence, even when the conductive layer 360 has a shape with a high aspect ratio, the conductive layer 360 can be formed without collapsing during the process.

The insulating layer 126 is preferably provided in contact with the top surface of the insulating layer 124, the top surface of the conductive layer 360, and the top surface of the insulating layer 350. When the insulating layer 126 is deposited by a sputtering method, excess-oxygen regions can be provided in the insulating layer 350 and the insulating layer 124. Accordingly, oxygen can be supplied from the excess-oxygen regions to the metal oxide 330.

For example, a metal oxide containing one or more kinds selected from hafnium, aluminum, gallium, yttrium, zirconium, tungsten, titanium, tantalum, nickel, germanium, magnesium, and the like can be used as the insulating layer 126.

In particular, aluminum oxide has a high barrier property, and even a thin aluminum oxide film having a thickness within the range of 0.5 nm to 3.0 nm can inhibit diffusion of hydrogen and nitrogen. Accordingly, aluminum oxide deposited by a sputtering method serves as an oxygen supply source and can also have a function of a barrier film against impurities such as hydrogen.

The insulating layer 128 functioning as an interlayer film is preferably provided over the insulating layer 126. As in the insulating layer 122 or the like, the concentration of impurities such as water and hydrogen in the insulating layer 128 is preferably reduced.

As shown in FIG. 9, an opening reaching a conductive layer 202_1 and an opening reaching a conductive layer 204_1 are provided in an insulating layer 126_1 and an insulating layer 128_1, and conductive layers 130_1 are provided to fill the openings. An opening reaching a conductive layer 206_1, an opening reaching a conductive layer 208_1, and an opening reaching a conductive layer 210_1 are provided in an insulating layer 123_1, an insulating layer 124_1, the insulating layer 126_1, and the insulating layer 128_1, and the conductive layers 130_1 are provided to fill the openings. The conductive layer 202_1 and the conductive layer 204_1 correspond to the conductive layer 360 shown in FIGS. 10(A) and 10(B), and the conductive layer 206_1, the conductive layer 208_1, and the conductive layer 210_1 correspond to the conductive layer 342a or the conductive layer 342b shown in FIG. 10(A).

The conductive layer 130 can have a two-layer structure of a conductive layer 130a and a conductive layer 130b as shown in FIG. 10(A). As a material of the conductive layer 130a and the conductive layer 130b, a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, it is preferable to be formed with a low-resistance conductive material such as aluminum or copper. The use of a low-resistance conductive material can reduce wiring resistance. For example, the conductive layer 130 may have a single-layer structure or a stacked-layer structure of three or more layers.

A conductive layer 131, a conductive layer 132, a conductive layer 134, a conductive layer 136, a conductive layer 138, and a conductive layer 140 are provided to have regions in contact with the conductive layer 130_1. The region 108 is electrically connected to the conductive layer 206_1 through the conductive layer 130_1 and the conductive layer 131. The conductive layer 132 is electrically connected to the conductive layer 202_1 through the conductive layer 130_1. The conductive layer 134 is electrically connected to the conductive layer 210_1 through the conductive layer 130_1. The conductive layer 136 is electrically connected to the conductive layer 204_1 through the conductive layer 130_1. The conductive layer 138 is electrically connected to the conductive layer 208_1 through the conductive layer 130_1. The conductive layer 140 is electrically connected to the region 110 through the conductive layer 130_1.

The conductive layer 132 can be part of the wiring 41_1 shown in FIG. 3. The conductive layer 136 can be part of the wiring 42_1 shown in FIG. 3. The conductive layer 138 can be part of the wiring 44_1 shown in FIG. 3. The conductive layer 140 can be part of the wiring 47 shown in FIG. 3.

As the conductive layer 131, the conductive layer 132, the conductive layer 134, the conductive layer 136, the conductive layer 138, and the conductive layer 140, a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like can be used. Alternatively, a conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added can be used.

The conductive layer 131, the conductive layer 132, the conductive layer 134, the conductive layer 136, the conductive layer 138, and the conductive layer 140 that are shown in FIG. 9 each have a single-layer structure; however, the structure is not limited thereto, and a stacked-structure of two or more layers can be used. For example, a conductor having a barrier property and a conductor highly adhesive to a conductor with high conductivity can be formed between a conductor having a barrier property and a conductor having high conductivity.

An insulating layer 142 is provided over the insulating layer 128_1, the conductive layer 131, the conductive layer 132, the conductive layer 134, the conductive layer 136, the conductive layer 138, and the conductive layer 140. The insulating layer 142 can have a structure similar to that of the insulating layer 112.

An insulating layer 144 is provided over the insulating layer 142. The insulating layer 144 can have a structure similar to that of the insulating layer 114. Accordingly, the insulating layer 144 can have a barrier property against hydrogen and the like and can suppress performance degradation of the OS transistor provided in the layer 30_2.

An insulating layer 116_2 is provided over the insulating layer 144, and the transistor 12_2 and the transistor 132 are provided over the insulating layer 116_2. As described above, the transistor 300 shown in FIGS. 10(A) and 10(B) can be used as the transistor 12_2 and the transistor 13_2. The transistor 12_1, the transistor 13_1, the transistor 12_2, and the transistor 13_2 can have the same structure.

In FIG. 9, the conductive layer 202_2 and the conductive layer 204_2 correspond to the conductive layer 360 shown in FIGS. 10(A) and 10(B), and the conductive layer 206_2, the conductive layer 208_2, and the conductive layer 210_2 correspond to the conductive layer 342a or the conductive layer 342b shown in FIG. 10(A).

A conductive layer 161, a conductive layer 162, a conductive layer 164, a conductive layer 166, a conductive layer 168, and a conductive layer 170 are provided so as to have regions in contact with the conductive layer 130_2. The region 108 is electrically connected to the conductive layer 206_2 through the conductive layer 130_1, the conductive layer 131, the conductive layer 130_2, and the conductive layer 161. The conductive layer 162 is electrically connected to the conductive layer 202_2 through the conductive layer 130_2. The conductive layer 164 is electrically connected to the conductive layer 210_2 through the conductive layer 130_2. The conductive layer 166 is electrically connected to the conductive layer 204_2 through the conductive layer 130_2. The conductive layer 168 is electrically connected to the conductive layer 208_2 through the conductive layer 130_2. The conductive layer 170 is electrically connected to the region 110 through the conductive layer 130_2, the conductive layer 140, and the conductive layer 130_1.

The conductive layer 162 can be part of the wiring 41_2 shown in FIG. 3. The conductive layer 166 can be part of the wiring 42_2 shown in FIG. 3. The conductive layer 168 can be part of the wiring 44_2 shown in FIG. 3. The conductive layer 170 can be part of the wiring 47 shown in FIG. 3.

The conductive layer 161, the conductive layer 162, the conductive layer 164, the conductive layer 166, the conductive layer 168, and the conductive layer 170 can have a structure similar to that of the conductive layer 131, the conductive layer 132, the conductive layer 134, the conductive layer 136, the conductive layer 138, and the conductive layer 140.

An insulating layer 172 is provided over the insulating layer 128_2, the conductive layer 161, the conductive layer 162, the conductive layer 164, the conductive layer 166, the conductive layer 168, and the conductive layer 170. The insulating layer 172 can have a structure similar to that of the insulating layer 112 and the insulating layer 142. The above is the description of the structure example of a pixel included in the imaging device 10 shown in FIG. 1 and the like.

As described above, the retention circuit 32_1 provided in the layer 30_1 can have a similar structure to that of the retention circuit 32_2 provided in the layer 30_2. Thus, as shown in FIG. 9, for example, the conductive layer 202_1 can have a region overlapping with the conductive layer 202_2, the conductive layer 204_1 can have a region overlapping with the conductive layer 204_2, the conductive layer 206_1 can have a region overlapping with the conductive layer 206_2, the conductive layer 208_1 can have a region overlapping with the conductive layer 208_2, and the conductive layer 210_1 can have a region overlapping with the conductive layer 210_2. The conductive layer 130_1 can have a region overlapping with the conductive layer 130_2. The conductive layer 131 can have a region overlapping with the conductive layer 161, the conductive layer 132 can have a region overlapping with the conductive layer 162, the conductive layer 134 can have a region overlapping with the conductive layer 164, the conductive layer 136 can have a region overlapping with the conductive layer 166, the conductive layer 138 can have a region overlapping with the conductive layer 168, and the conductive layer 140 can have a region overlapping with the conductive layer 170.

Thus, even when a material blocking visible light is used for the conductive layers, this can inhibit the decrease in the aperture ratio of the imaging device 10 compared to the case where only one layer 30 is provided. Therefore, the imaging device of one embodiment of the present invention can achieve both obtaining a plurality of imaging data in a short period and imaging data corresponding to a high-quality image.

The retention circuit 32_2 can be manufactured using the same mask as the mask used for manufacturing the retention circuit 32_1. This inhibits increase in the number of masks used for manufacturing the imaging device 10 compared to the case where only one layer 30 is provided. Thus, manufacturing cost for the imaging device 10 can be inhibited from being much higher than that of the case where only one layer 30 is provided, and the imaging device 10 can be inexpensive.

Structure Example 2 of Pixel

Figure 11A:
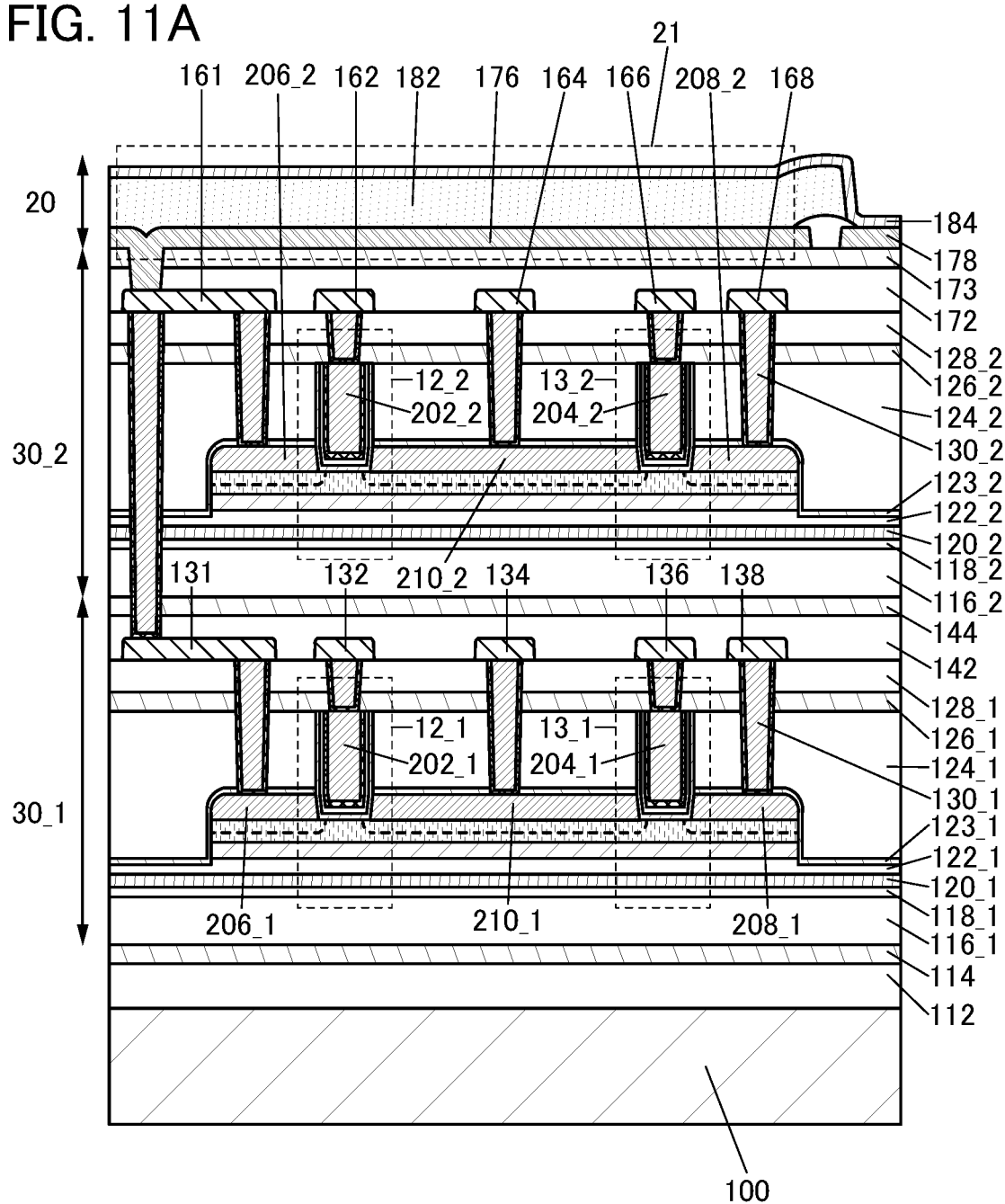
FIG. 11 (A) A cross-sectional view showing a structure example of the imaging device. (B) A cross-sectional view showing a structure example of a photoelectric conversion element.

FIG. 11(A) shows a specific structure example of a pixel included in the imaging device 10, and a modification example of the structure in FIG. 9. In FIG. 11(A), the layers 30 are provided under the layer 20. Thus, the structure shown in FIG. 11(A) can be used for the imaging device 10 having the structure shown in FIG. 7, for example.

In a pixel in the structure of FIG. 11(A), the insulating layer 112 is provided over the substrate 100, the insulating layer 114 is provided over the insulating layer 112, and the layer 30 is provided over the insulating layer 114. The substrate 100 can be, for example, a substrate including silicon such as a single crystal silicon substrate.

An insulating layer 173 is provided over the insulating layer 172. The insulating layer 173 can have a structure similar to that of the insulating layer 114 shown in FIG. 9.

The photoelectric conversion element 21 is provided over the insulating layer 173. The photoelectric conversion element 21 includes a conductive layer 176, a photoelectric conversion layer 182, and a conductive layer 184. The conductive layer 176 has a function of one electrode of the photoelectric conversion element 21, and the conductive layer 184 has a function of the other electrode of the photoelectric conversion element 21.

An opening reaching the conductive layer 161 is provided in the insulating layer 173 and the insulating layer 172, and the conductive layer 176 can be formed to fill the opening. The one of the source and the drain of the transistor 12 is electrically connected to the one electrode of the photoelectric conversion element 21. A conductive layer having a structure similar to that of the conductive layer 130 may be provided in the opening and the conductive layer 176 may be provided to have a region in contact with the conductive layers.

A conductive layer 178 is provided in the layer 20 to be apart from the conductive layer 176. For example, the conductive layer 178 can be formed using the same material in the same manufacturing step as the conductive layer 176. The conductive layer 178 can be part of the wiring 47 shown in FIG. 3. The conductive layer 184 can be provided to have a region in contact with the conductive layer 178. This can electrically connect the other electrode of the photoelectric conversion element 21 and the wiring 47. Note that the conductive layer 178 and the conductive layer 184 may be electrically connected through another conductive layer without direct contact.

The photoelectric conversion layer 182 can include a selenium-based material. The photoelectric conversion element 21 using a selenium-based material has a property of high external quantum efficiency with respect to visible light. Furthermore, a selenium-based material has a high light-absorption coefficient, which is advantageous because the photoelectric conversion layer 182 can easily be made thin. The photoelectric conversion element 21 using a selenium-based material can be a highly sensitive sensor in which the amount of amplification is large because of avalanche multiplication. In other words, the use of a selenium-based material for the photoelectric conversion layer 182 allows sufficient photoelectric current to be obtained albeit a pixel area becomes small; the imaging device 10 can have high sensitivity. Thus, the imaging device 10 including the photoelectric conversion element 21 using a selenium-based material is also suitable for imaging in a low-illuminance environment.

As a selenium-based material, amorphous selenium or crystalline selenium can be used. Crystalline selenium can be obtained, for example, by subjecting amorphous selenium to heat treatment after deposition. When the crystal grain size of crystalline selenium is smaller than a pixel pitch, variations in characteristics between pixels can be reduced. Moreover, crystalline selenium has properties with higher spectral sensitivity and light-absorption coefficient for visible light than amorphous selenium.

The photoelectric conversion layer 182 may be a layer containing a compound of copper, indium, and selenium (CIS). Alternatively, a layer containing a compound of copper, indium, gallium, and selenium (CIGS) may be used. With CIS or CIGS, a photoelectric conversion element that utilizes avalanche multiplication as in the case of using a single layer of selenium can be formed.

The conductive layer 184 preferably has a light-transmitting property. The light-transmitting conductive layer 184 can have a structure including indium tin oxide, indium tin oxide containing silicon, indium oxide containing zinc, zinc oxide, zinc oxide containing gallium, zinc oxide containing aluminum, tin oxide, tin oxide containing fluorine, tin oxide containing antimony, graphene, or graphene oxide, for example. The conductive layer 184 is not limited to a single layer, and may be a stacked layer of films with different materials.

Figure 11B:
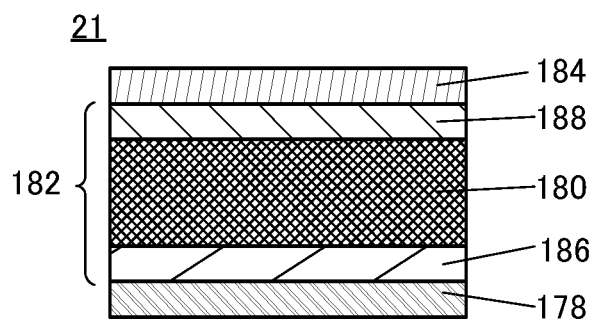

Here, an organic compound may be used for the photoelectric conversion layer 182. FIG. 11(B) is a cross-sectional view showing a structure example of the photoelectric conversion element 21 when an organic compound is used for the photoelectric conversion layer 182.

As shown in FIG. 11(B), a hole-transport layer 186, an active layer 180, and an electron-transport layer 188 are sequentially stacked in the photoelectric conversion layer 182. In this case, the conductive layer 178 has a function of the anode of the photoelectric conversion element 21, and the conductive layer 184 has a function of the cathode of the photoelectric conversion element 21. Note that when the conductive layer 178 has a function of the cathode of the photoelectric conversion element 21 and the conductive layer 184 has a function of the anode of the photoelectric conversion element 21, the stacking order is inverted.

The active layer 180 has a function of absorbing light which is emitted to the photoelectric conversion element 21. Owing to the photoelectric effect, a current depending on the illuminance of the light absorbed by the active layer 180 flows through the photoelectric conversion element 21. The active layer 180 can be formed using a combination of a plurality of organic materials as appropriate. For example, the active layer 180 can have a structure including tetraphenyldibenzoperiflanthene (DBP) and fullerene.

The hole-transport layer 186 has a function of transporting holes from the conductive layer 178 having a function of the anode to the active layer 180. The hole-transport layer 186 contains a hole-transport material. For example, the hole-transport layer 186 can contain molybdenum oxide. Note that the hole-transport layer 186 can be formed using any material other than the above-described materials as long as the material has a hole-transport property higher than an electron-transport property.

The electron-transport layer 188 has a function of transporting electrons from the conductive layer 184 having a function of the cathode to the active layer 180. The electron-transport layer 188 contains an electron-transport material. The electron-transport layer 188 can have a one-layer structure or a stacked-layer structure of two or more layers. For example, a stacked-layer structure of fullerene and bathocuproine (BCP) can be used. Note that the electron-transport layer 188 can be formed using any material other than the above-described materials as long as the material has an electron-transport property higher than a hole-transport property.

When an organic compound is used for the photoelectric conversion layer 182 in the photoelectric conversion element 21, the imaging device 10 can be inexpensive. In addition, the imaging device 10 can have flexibility.

Structure Example 3 of Pixel

Figure 12A:
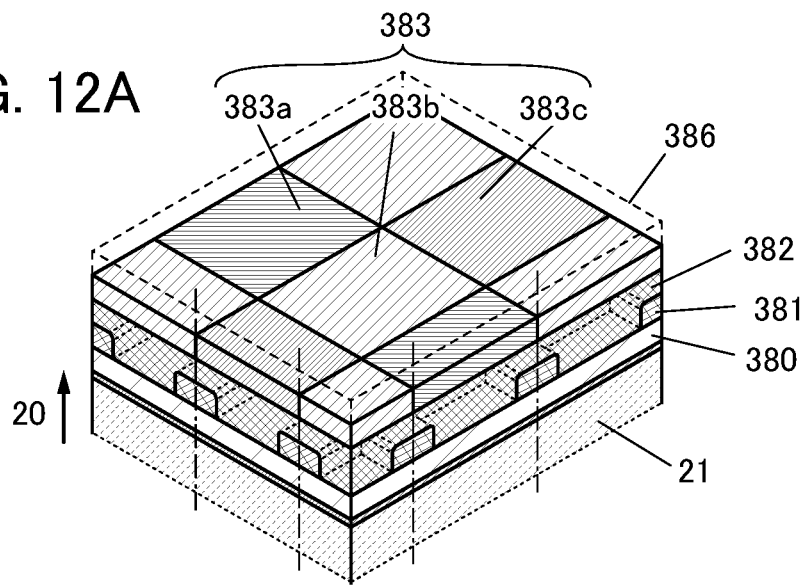
FIG. 12 (A), (B), (C) Perspective views showing structure examples of the imaging device.

FIG. 12(A) is a perspective view showing an example in which a coloring layer (color filter) and the like are added to the pixel included in the imaging device 10. In the perspective view, cross sections of a plurality of pixels are also shown. An insulating layer 380 is formed over the layer 20 where the photoelectric conversion element 21 is formed. As the insulating layer 380, a silicon oxide film with a high light-transmitting property with respect to visible light can be used. A silicon nitride film may be stacked as a passivation film. A dielectric film of hafnium oxide or the like may be stacked as an anti-reflection film.

A light-blocking layer 381 may be formed over the insulating layer 380. The light-blocking layer 381 has a function of preventing color mixing of light passing through the upper coloring layer. As the light-blocking layer 381, a metal layer of aluminum, tungsten, or the like can be used. Alternatively, the metal layer and a dielectric film having a function of an anti-reflection film may be stacked.

An organic resin layer 382 can be provided as a planarization film over the insulating layer 380 and the light-blocking layer 381. A coloring layer 383 (a coloring layer 383a, a coloring layer 383b, a coloring layer 383c) is formed in the pixel. When colors of R (red), G (green), B (blue), Y (yellow), C (cyan), and M (magenta) are assigned to the coloring layer 383a, the coloring layer 383b, and the coloring layer 383c, for example, a color image can be obtained.

An insulating layer 386 having a light-transmitting property with respect to visible light can be provided over the coloring layer 383, for example.

Figure 12B:
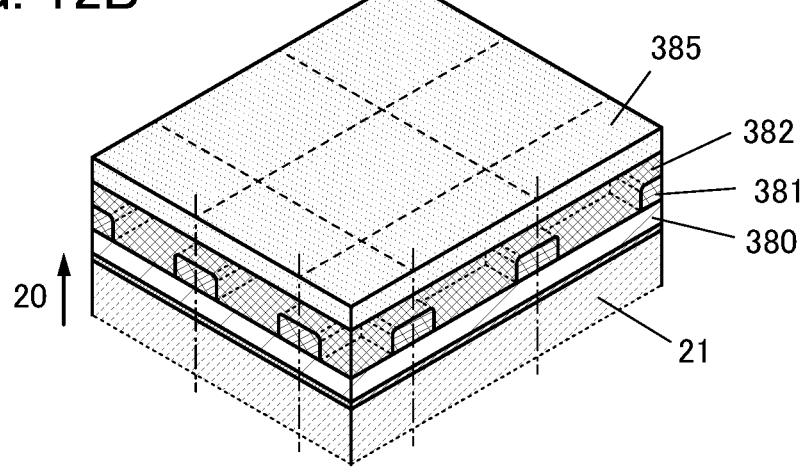

As shown in FIG. 12(B), an optical conversion layer 385 may be used instead of the coloring layer 383. Such a structure enables the imaging device capable of obtaining images in various wavelength regions.

When a filter that blocks light with a wavelength shorter than or equal to that of visible light is used as the optical conversion layer 385, for example, it is possible to obtain an infrared imaging device. When a filter that blocks light with a wavelength shorter than or equal to that of near infrared light is used as the photoelectric conversion layer 385, it is possible to obtain a far-infrared imaging device. When a filter that blocks light with a wavelength longer than or equal to that of visible light is used as the photoelectric conversion layer 385, it is possible to obtain an ultraviolet imaging device.

Alternatively, a coloring layer for visible light and a filter for infrared rays or ultraviolet rays may be combined. With such a structure, a feature obtained by combining different wavelength data can be detected.

Furthermore, when a scintillator is used as the optical conversion layer 385, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the light is detected by the photoelectric conversion element 21, whereby image data is obtained. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, ZnO, or the like is dispersed can be used.

In the photoelectric conversion element 21 using a selenium-based material, radiation such as X-rays can be directly converted into charge; thus, a structure in which the scintillator is unnecessarily can also be employed.

Figure 12C:
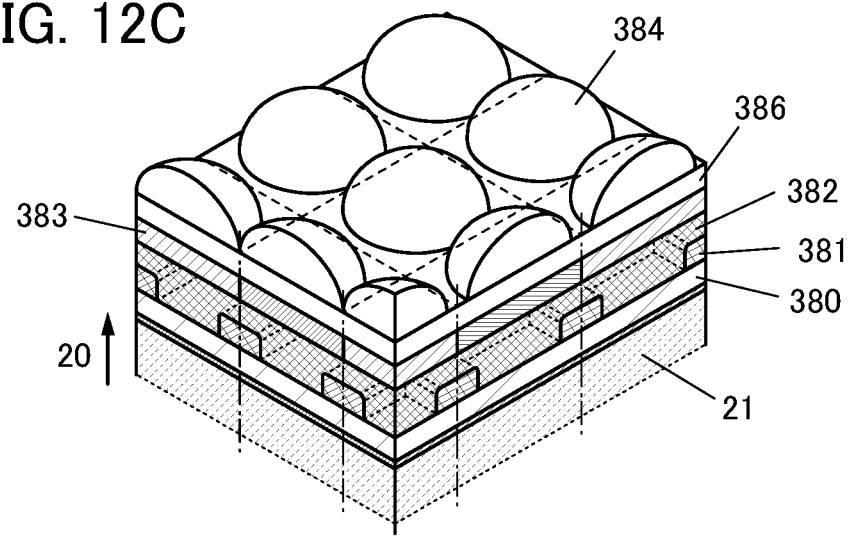

As shown in FIG. 12(C), a microlens array 384 may be provided over the coloring layer 383. Light passing through lenses of the microlens array 384 goes through the coloring layer 383 positioned thereunder and the photoelectric conversion element 21 is irradiated with the light. The microlens array 384 may be provided over the optical conversion layer 385 shown in FIG. 12(B).

This embodiment can be combined with any of the other embodiments as appropriate.

Embodiment 2

In this embodiment, a structure example of a transistor that can be used for the imaging device of one embodiment of the present invention is described with reference to drawings.

Transistor Structure Example 1

Figure 13A:
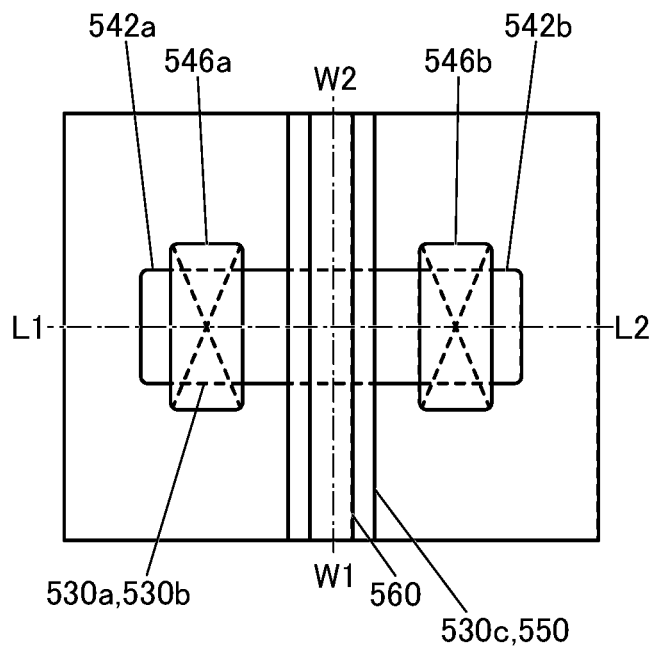
FIG. 13 (A) A top view showing a structure example of a transistor, (B), (C) Cross-sectional views showing a structure example of the transistor.
Figure 13C:
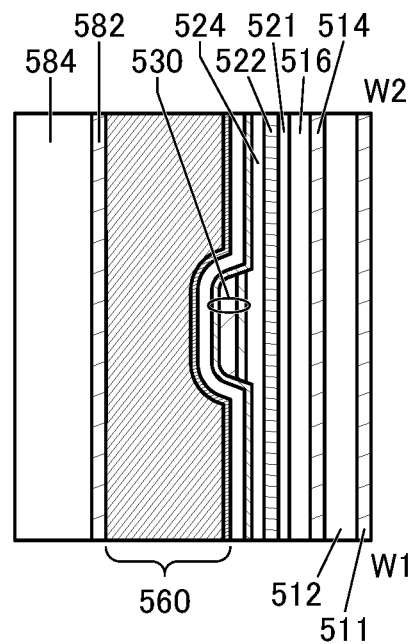
Figure 13B:
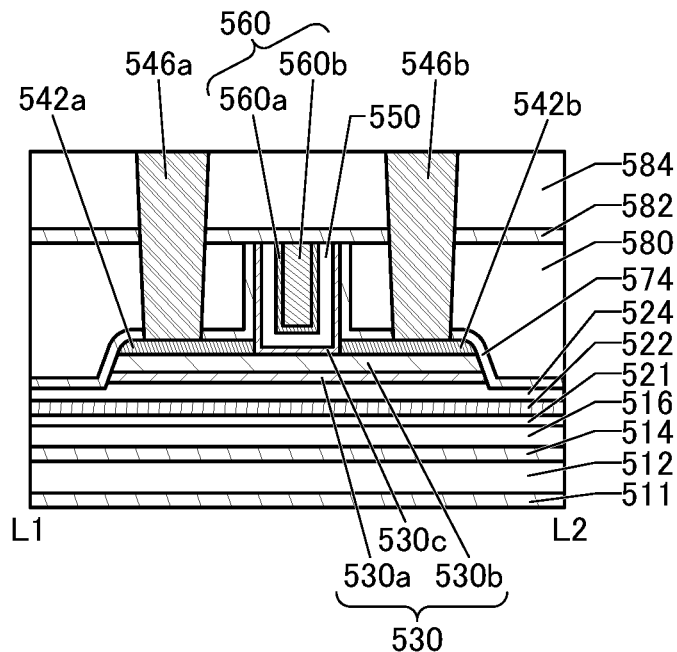

A structure example of a transistor 510A is described with reference to FIGS. 13(A), 13(B), and 13(C). FIG. 13(A) is a top view of the transistor 510A. FIG. 13(B) is a cross-sectional view of a portion indicated by a dashed-dotted line L1-L2 in FIG. 13(A). FIG. 13(C) is a cross-sectional view of a portion indicated by a dashed-dotted line W1-W2 in FIG. 13(A). Note that for clarification of the drawing, some components are not shown in the top view of FIG. 13(A), FIGS. 13(A), 13(B), and 13(C) show the transistor 510A, an insulating layer 511, an insulating layer 512, an insulating layer 514, an insulating layer 516, an insulating layer 521, an insulating layer 522, and an insulating layer 574, an insulating layer 580, an insulating layer 582, and an insulating layer 584 that has a function as interlayer films. In addition, conductive layers 546 (a conductive layer 546a and a conductive layer 546b) that are electrically connected to the transistor 510A and have a function as contact plugs are shown.

The transistor 510A includes an insulating layer 524 that has a function of base insulating layer; a conductive layer 560 (a conductive layer 560a and a conductive layer 560b) functioning as a gate electrode; an insulating layer 550 functioning as a gate insulating film; a metal oxide 530 (a metal oxide 530a, a metal oxide 530b, and a metal oxide 530c) including a region where a channel is formed; a conductive layer 542a functioning as one of a source and a drain; and a conductive layer 542b functioning as the other of the source and the drain.

In the transistor 510A shown in FIG. 13, the metal oxide 530c, the insulating layer 550, and the conductive layer 560 are positioned in an opening provided in the insulating layer 580 with the insulating layer 574 positioned therebetween. Moreover, the metal oxide 530c, the insulating layer 550, and the conductive layer 560 are positioned between a conductive layer 542a and a conductive layer 542b.

The insulating layer 511 and the insulating layer 512 have a function as interlayer films.

As the interlayer film, a single layer or stacked layers of an insulating layer such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to the insulating layer, for example. Alternatively, the insulating layer may be subjected to nitriding treatment. Silicon oxide, silicon oxynitride, or silicon nitride may be stacked over the insulating layer.

For example, the insulating layer 511 preferably has a function as a barrier film that inhibits entry of impurities such as water and hydrogen into the transistor 510A from the substrate side. Accordingly, for the insulating layer 511, it is preferable to use an insulating material that has a function of inhibiting diffusion of impurities such as a hydrogen atom, a hydrogen molecule, a water molecule, and a copper atom (through which the above impurities are less likely to pass). Alternatively, the insulator 511 is preferably formed using an insulating material having a function of inhibiting diffusion of oxygen (e.g., oxygen atoms and oxygen molecules), that is, an insulating material through which oxygen is less likely to pass. Moreover, aluminum oxide or silicon nitride, for example, may be used for the insulating layer 511. This structure can inhibit diffusion of impurities such as hydrogen and water to the transistor 510A side from the substrate side of the insulating layer 511.

For example, the dielectric constant of the insulating layer 512 is preferably lower than that of the insulating layer 511. When a material with a low permittivity is used as an interlayer film, the parasitic capacitance generated between wirings can be reduced.

In the transistor 510A, the conductive layer 560 sometimes has a function as a gate.

Like the insulating layer 511 or the insulating layer 512, the insulating layer 514 and the insulating layer 516 have a function as interlayer films. For example, the insulating layer 514 preferably has a function as a barrier film that inhibits entry of impurities such as water and hydrogen into the transistor 510A from the substrate side. This structure can inhibit diffusion of impurities such as hydrogen and water to the transistor 510A side from the substrate side of the insulating layer 514. Moreover, for example, the insulating layer 516 preferably has a lower dielectric constant than the insulating layer 514. When a material with a low permittivity is used as an interlayer film, the parasitic capacitance generated between wirings can be reduced.

The insulating layer 522 preferably has a barrier property. The insulating layer 522 having a barrier property has a function as a layer that inhibits entry of impurities such as hydrogen into the transistor 510A from the surroundings of the transistor 510A.

For the insulating layer 522, a single layer or stacked layers of an insulating layer containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. As miniaturization and high integration of transistors progress, a problem such as generation of leakage current may arise because of a thinner gate insulating film. When a high-k material is used for an insulator having a function as the gate insulating film, a gate potential during operation of the transistor can be reduced while the physical thickness is maintained.

It is preferable that the insulating layer 521 be thermally stable, for example. For example, silicon oxide and silicon oxynitride are thermal stable; thus, the insulating layer 521 is formed using a high-k material and the insulating layer 522 is formed using a material containing silicon oxide and/or oxynitride, which can achieve a thermally stable and high dielectric constant stacking structure.

The metal oxide 530 including a region having a function as the channel formation region includes the metal oxide 530a, the metal oxide 530b over the metal oxide 530a, and the metal oxide 530c over the metal oxide 530b. Including the metal oxide 530a under the metal oxide 530b makes it possible to inhibit diffusion of impurities into the metal oxide 530b from the components formed below the metal oxide 530a. The metal oxide 530c over the metal oxide 530b can inhibit diffusion of impurities into the metal oxide 530b from the components formed above the metal oxide 530c. As the metal oxide 530, the above-described oxide semiconductor, which is one kind of metal oxide, can be used.

Note that the metal oxide 530c is preferably provided in the opening provided in the insulating layer 580 with the insulating layer 574 positioned therebetween. When the insulating layer 574 has a barrier property, diffusion of impurities from the insulating layer 580 into the metal oxide 530 can be inhibited.

One of conductive layers 542 has a function as a source electrode and the other has a function as a drain electrode.

For the conductive layer 542a and the conductive layer 542b, a metal such as aluminum, titanium, chromium, nickel, copper, yttrium, zirconium, molybdenum, silver, tantalum, or tungsten or an alloy containing any of the metals as its main component can be used. In particular, a metal nitride film such as tantalum nitride is preferable because it has a barrier property against hydrogen or oxygen and high oxidation resistance.

Although a single-layer structure is shown in FIG. 13, a stacked-layer structure of two or more layers may be employed. For example, a tantalum nitride film and a tungsten film may be stacked. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer may be provided over the conductive layer 542. The barrier layer is preferably formed using a material having a barrier property against oxygen or hydrogen. This structure can inhibit oxidation of the conductive layer 542 at the time of depositing the insulating layer 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductive layer 542 can be expanded. For example, a material having a low oxidation resistance and high conductivity, such as tungsten or aluminum, can be used for the conductive layer 542. Moreover, for example, a conductive layer that can be easily deposited or processed can be used.

The insulating layer 550 has a function of a gate insulating film. The insulating layer 550 is preferably provided in the opening provided in the insulating layer 580 with the metal oxide 530c and the insulating layer 574 positioned therebetween.

As miniaturization and high integration of transistors progress, a problem such as generation of leakage current may arise because of a thinner gate insulating film. In that case, the insulating layer 550 may have a stacked-layer structure. When the insulator having a function as the gate insulating film has a stacked-layer structure of a high-k material and a thermally stable material, a gate potential during operation of the transistor can be reduced while the physical thickness is maintained. Furthermore, the stacked-layer structure can be thermally stable and have a high dielectric constant.

The conductive layer 560 having a function as a gate includes the conductive layer 560a and the conductive layer 560b over the conductive layer 560a. The conductive layer 560a is preferably formed using a conductive material having a function of inhibiting diffusion of impurities such as a hydrogen atom, a hydrogen molecule, a water molecule, and a copper atom. Alternatively, the conductive layer 560a is preferably formed using a conductive material having a function of inhibiting diffusion of oxygen (e.g., at least one of oxygen atoms and oxygen molecules). Note that in this specification and the like, a function of inhibiting diffusion of impurities or oxygen means a function of inhibiting diffusion of any one or all of the above impurities and oxygen.

When the conductive layer 560a has a function of inhibiting oxygen diffusion, the range of choices for the material of the conductive layer 560b can be expanded. That is, when the conductive layer 560a is provided, a decrease in the conductivity of the conductive layer 560b due to oxidization can be suppressed even when the material which is easily oxidized is used for the conductive layer 560b.

As a conductive material having a function of inhibiting oxygen diffusion, tantalum, tantalum nitride, ruthenium, or ruthenium oxide is preferably used, for example. For the conductive layer 560a, the oxide semiconductor that can be used as the metal oxide 530 can be used. In that case, when the conductive layer 560b is deposited by a sputtering method, the electric resistance of the conductive layer 560a is lowered so that the conductive layer 560a can become a conductive layer. Such a conductor can be referred to as an OC (Oxide Conductor) electrode.

The conductive layer 560b is preferably formed using a conductive material containing tungsten, copper, or aluminum as its main component. The conductive layer 560 has a function as a wiring and thus a conductive layer having high conductivity is preferably used. For example, a conductive material containing tungsten, copper, or aluminum as its main component can be used. The conductive layer 560b may have a stacked-layer structure, for example, a stack of any of the above conductive materials and titanium or titanium nitride.

The insulating layer 574 is positioned between the insulating layer 580 and the transistor 510A. Note that the insulating layer 574 is preferably formed using an insulating material having a function of inhibiting diffusion of oxygen and impurities such as water or hydrogen. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The insulating layer 574 of the imaging device of one embodiment of the present invention can inhibit diffusion of impurities such as water and hydrogen contained in the insulating layer 580 into the metal oxide 530b through the metal oxide 530c and the insulating layer 550. In addition, oxidation of the conductive layer 560 due to excess oxygen contained in the insulating layer 580 can be inhibited.

The insulating layer 580, the insulating layer 582, and the insulating layer 584 have a function as interlayer films.

Like the insulating layer 514, the insulating layer 582 preferably has a function as a barrier insulating film that inhibits entry of impurities such as water and hydrogen into the transistor 510A from the outside.

Like the insulating layer 516, the insulating layer 580 and the insulating layer 584 preferably have a lower dielectric constant than the insulating layer 582. When a material with a low permittivity is used as an interlayer film, the parasitic capacitance generated between wirings can be reduced.

The transistor 510A may be electrically connected to another component through a plug and a wiring such as the conductive layer 546 embedded in the insulating layer 580, the insulating layer 582, and the insulating layer 584.

As a material for the conductive layer 546, a conductive material such as a metal material, an alloy material, a metal nitride material, or a metal oxide material can be used as a single layer or stacked layers. For example, it is preferable to use a high-melting-point material that has both heat resistance and conductivity, such as tungsten or molybdenum. Alternatively, it is preferable to form the plugs and wirings with a low-resistance conductive material such as aluminum or copper. The use of a low-resistance conductive material can reduce wiring resistance.

For example, when the conductive layer 546 has a stacked-layer structure of tantalum nitride or the like, which is a conductive layer having a barrier property against hydrogen and oxygen, and tungsten, which has high conductivity, diffusion of impurities from the outside can be inhibited while the conductivity of a wiring is maintained.

The transistor having the above-described structure is used as the transistor included in the imaging device of one embodiment of the present invention, whereby the imaging device of one embodiment of the present invention can be an imaging device including a transistor having a metal oxide and high on-state current. Alternatively, the imaging device of one embodiment of the present invention can be an imaging device including a transistor having a metal oxide and low off-state current. Alternatively, the imaging device of one embodiment of the present invention can be an imaging device that has small variation in electrical characteristics, stable electrical characteristics, and improved reliability.

Transistor Structure Example 2

Figure 14A:
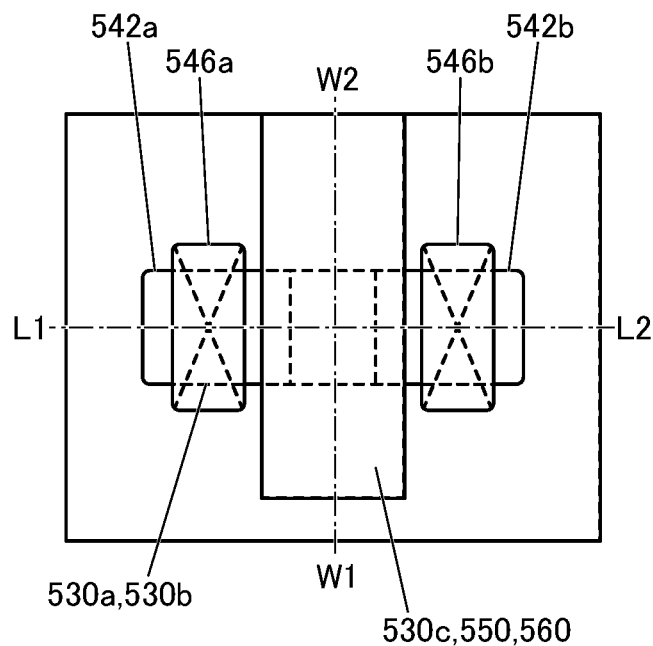
FIG. 14 (A) A top view showing a structure example of a transistor. (B), (C) Cross-sectional views showing a structure example of the transistor.
Figure 14C:
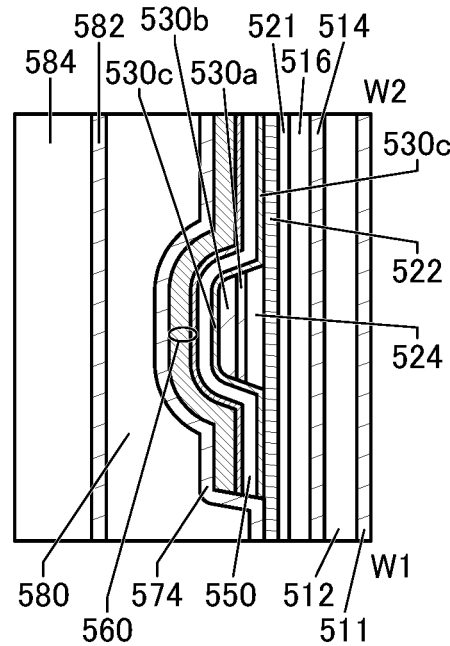
Figure 14B:
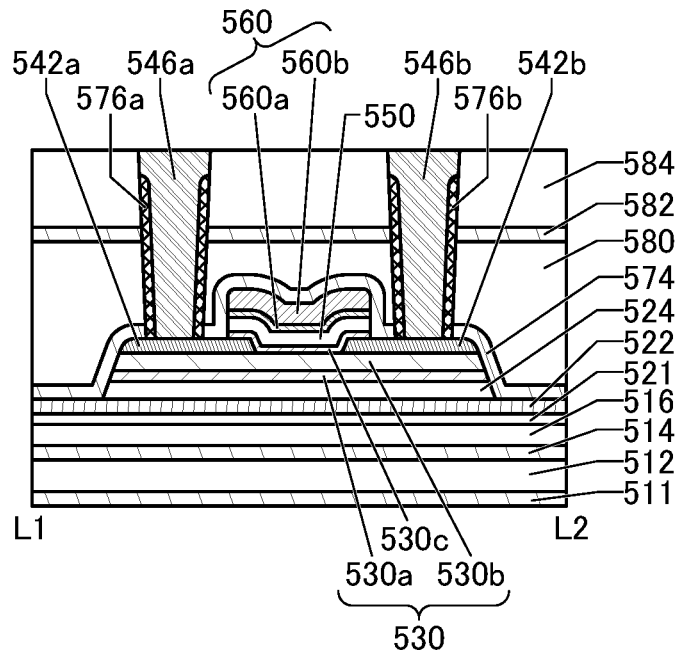

A structure example of a transistor 510B is described with reference to FIGS. 14(A), 14(B), and 14(C). FIG. 14(A) is a top view of the transistor 510B. FIG. 14(B) is a cross-sectional view of a portion, indicated by a dashed-dotted line L1-L2 in FIG. 14(A). FIG. 14(C) is a cross-sectional view of a portion indicated by a dashed-dotted line W1-W2 in FIG. 14(A). Note that for clarification of the drawing, some components are not shown in the top view of FIG. 14(A).

The transistor 510B is a variation example of the transistor 510A. Therefore, differences from the transistor 510A are mainly described to avoid repeated description.

The transistor 510B includes a region where the conductive layer 542 (the conductive layer 542a and the conductive layer 542b), the metal oxide 530c, the insulating layer 550, and the conductive layer 560 overlap with each other. With this structure, a transistor having a high on-state current can be provided. Moreover, a transistor having high controllability can be provided.

The conductive layer 560 having a function as a gate electrode includes the conductive layer 560a and the conductive layer 560b over the conductive layer 560a. The conductive layer 560a is preferably formed using a conductive material having a function of inhibiting diffusion of impurities such as a hydrogen atom, a hydrogen molecule, a water molecule, and a copper atom. Alternatively, the conductive layer 560a is preferably formed using a conductive material having a function of inhibiting diffusion of oxygen (e.g., at least one of oxygen atoms and oxygen molecules).

When the conductive layer 560a has a function of inhibiting oxygen diffusion, the range of choices for the material of the conductive layer 560b can be expanded. That is, the conductive layer 560a inhibits oxidation of the conductive layer 560b, thereby preventing the decrease in conductivity of the conductive layer 560b.

The insulating layer 574 is preferably provided to cover the top surface and the side surface of the conductive layer 560, the side surface of the insulating layer 550, and the side surface of the metal oxide 530c. Note that the insulating layer 574 is preferably formed using an insulating material having a function of inhibiting diffusion of oxygen and impurities such as water or hydrogen. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The insulating layer 574 can inhibit oxidation of the conductive layer 560. Moreover, providing the insulating layer 574 can inhibit diffusion of impurities such as water and hydrogen contained in the insulating layer 580 into the transistor 510B.

An insulating layer 576 (an insulating layer 576a and an insulating layer 576b) having a barrier property may be provided between the conductive layer 546 and the insulating layer 580. Providing the insulating layer 576 can prevent oxygen in the insulating layer 580 from reacting with the conductive layer 546 and oxidizing the conductive layer 546.

Furthermore, with the insulating layer 576 having a barrier property, the range of choices for the material of the conductive layer used as the plug or the wiring can be expanded. The use of a metal material having an oxygen absorbing property and high conductivity for the conductive layer 546, for example, can provide an imaging device with low power consumption. Specifically, a material having a low oxidation resistance and high conductivity, such as tungsten or aluminum, can be used. Moreover, for example, a conductive layer that can be easily deposited or processed can be used for the conductive layer 546.

Transistor Structure Example 3

Figure 15A:
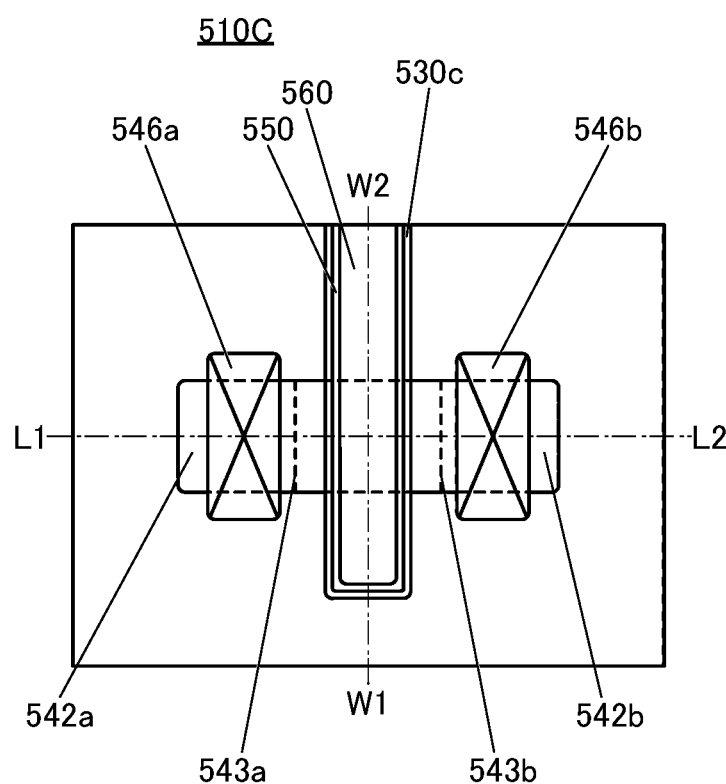
FIG. 15 (A) A top view showing a structure example of a transistor. (B), (C) Cross-sectional views showing a structure example of the transistor.
Figure 15C:
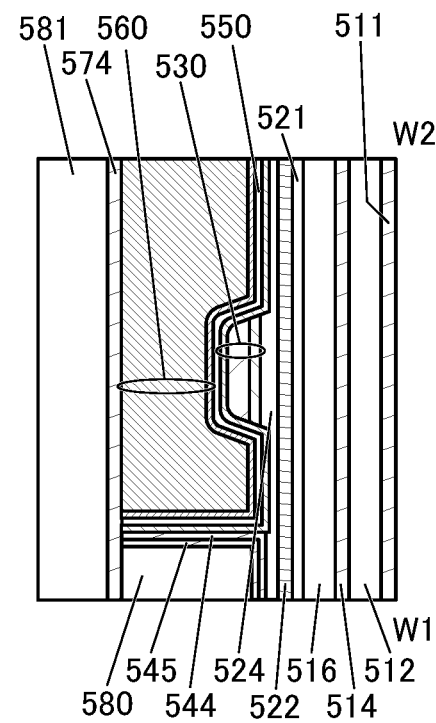
Figure 15B:
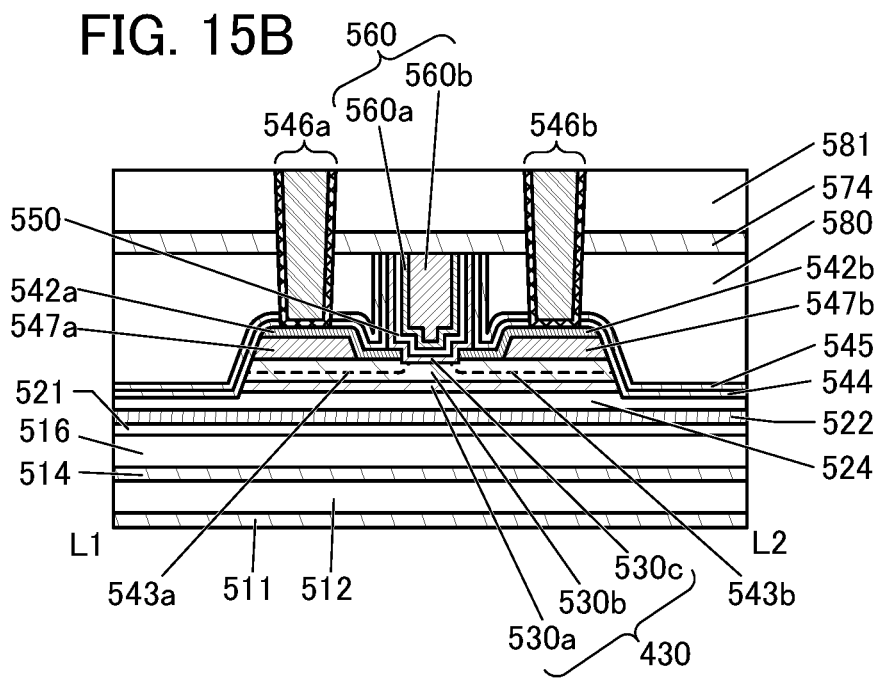

A structure example of a transistor 510C is described with reference to FIGS. 15(A), 15(B), and 15(C). FIG. 15(A) is a top view of the transistor 510C. FIG. 15(B) is a cross-sectional view of a portion indicated by a dashed-dotted line L1-L2 in FIG. 15(A). FIG. 15(C) is a cross-sectional view of a portion indicated by a dashed-dotted line W1-W2 in FIG. 15(A). Note that for clarification of the drawing, some components are not shown in the top view of FIG. 15(A).

The transistor 510C is a variation example of the transistor 510A. Therefore, differences from the transistor 510A are mainly described to avoid repeated description.

The transistor 510C shown in FIG. 15 includes a conductive layer 547a between the conductive layer 542a and the metal oxide 530b, and a conductive layer 547b between the conductive layer 542b and the metal oxide 530b. Here, the conductive layer 542a (the conductive layer 542b) extends beyond the top surface and the side surface on the conductive layer 560 side of the conductive layer 547a (the conductive layer 547b), and includes a region in contact with the top surface of the metal oxide 530b. For the conductive layer 547, a conductive layer that can be used for the conductive layer 542 is used. It is preferred that the thickness of the conductive layer 547 be at least greater than that of the conductive layer 542.

In the transistor 510C shown in FIG. 15 having such a structure, the conductive layer 542 can be closer to the conductive layer 560 than that in the transistor 510A is.

Alternatively, the conductive layer 560 and an end portion of the conductive layer 542a and an end portion of the conductive layer 542b can overlap with each other. Accordingly, the effective channel length of the transistor 510C can be shortened, and the on-state current and the frequency characteristics can be improved.

The conductive layer 547a (the conductive layer 547b) is preferably provided to overlap with the conductive layer 542a (the conductive layer 542b). With such a structure, the conductive layer 547a (the conductive layer 547b) functioning as a stopper can prevent over-etching of the metal oxide 530b by etching for forming the opening where the conductive layer 546a (the conductive layer 546b) is to be embedded.

In the transistor 510C shown in FIG. 15, an insulating layer 545 may be positioned on and in contact with an insulating layer 544. The insulating layer 544 preferably has a function as a barrier insulating film that inhibits entry of impurities such as water and hydrogen and excess oxygen into the transistor 510C from the insulating layer 580 side. As the insulating layer 545, an insulating layer that can be used as the insulating layer 544 can be used. In addition, the insulating layer 544 may be formed using a nitride insulating layer such as aluminum nitride, aluminum titanium nitride, titanium nitride, silicon nitride, or silicon nitride oxide, for example.

Transistor Structure Example 4

Figure 16A:
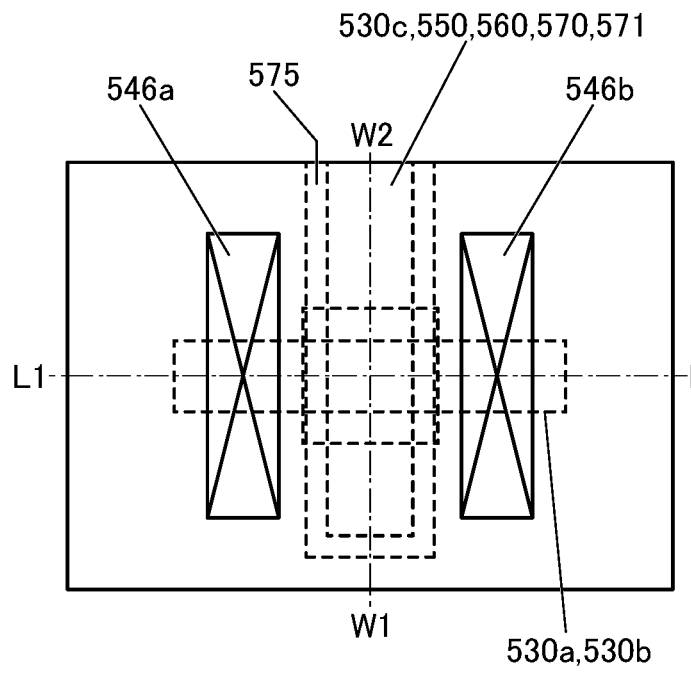
FIG. 16 (A) A top view showing a structure example of a transistor. (B), (C) Cross-sectional views showing a structure example of the transistor.
Figure 16C:
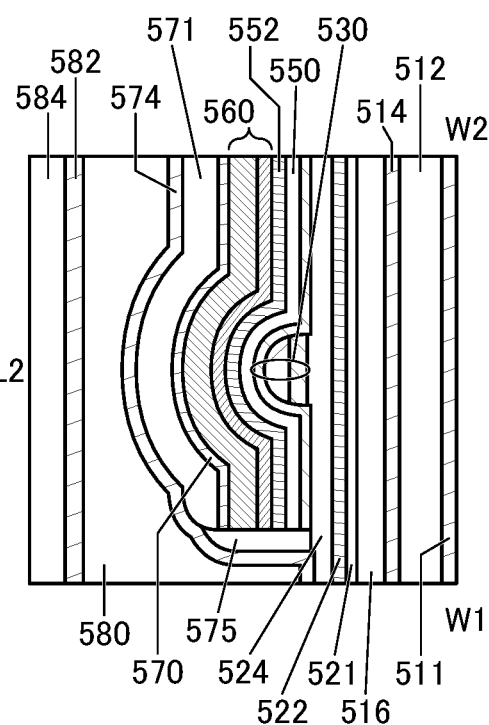
Figure 16B:
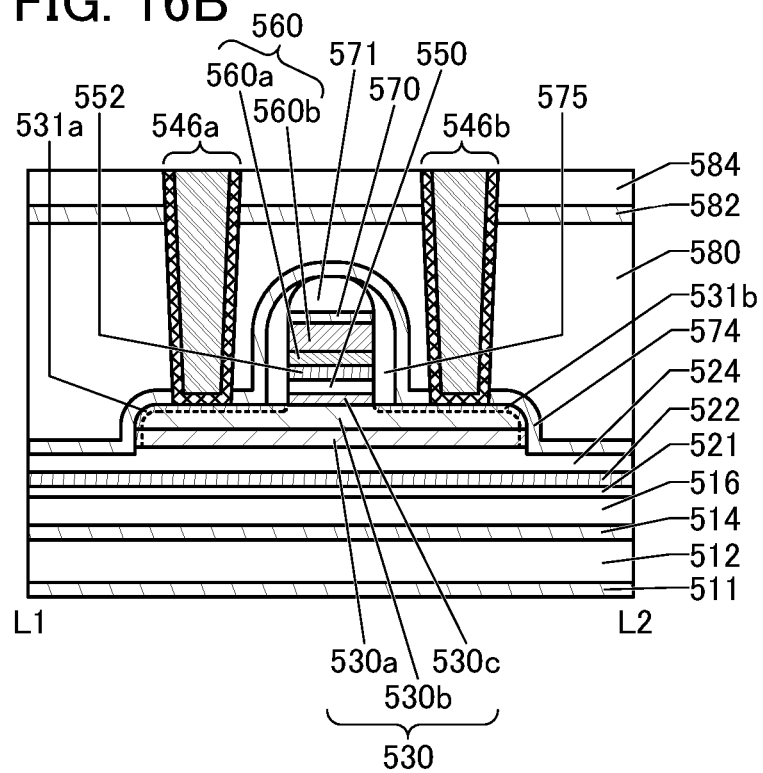

A structure example of a transistor 510D is described with reference to FIGS. 16(A), 16(B), and 16(C). FIG. 16(A) is a top view of the transistor 510D. FIG. 16(B) is a cross-sectional view of a portion indicated by a dashed-dotted line L1-L2 in FIG. 16(A). FIG. 16(C) is a cross-sectional view of a portion indicated by a dashed-dotted line W1-W2 in FIG. 16(A). Note that for clarification of the drawing, some components are not shown in the top view of FIG. 16(A).

The transistor 510D is a variation example of the above transistors. Therefore, differences from the above transistors are mainly described to avoid repeated description.

The transistor 510D includes the insulating layer 550 over the oxide 530c and a metal oxide 552 over the insulating layer 550. The conductive layer 560 is provided over the metal oxide 552, and an insulating layer 570 is provided over the conductive layer 560. An insulating layer 571 is provided over the insulating layer 570.

The metal oxide 552 preferably has a function of inhibiting diffusion of oxygen. When the metal oxide 552 that inhibits diffusion of oxygen is provided between the insulating layer 550 and the conductive layer 560, diffusion of the oxygen to the conductive layer 560 is inhibited. That is, the reduction in the amount of oxygen supplied to the metal oxide 530 can be inhibited. Furthermore, oxidation of the conductive layer 560 can be inhibited.

Note that the metal oxide 552 may function as part of a gate. For example, an oxide semiconductor that can be used for the metal oxide 530 can be used for the metal oxide 552. In that case, when the conductive layer 560 is deposited by a sputtering method, the electric resistance of the metal oxide 552 is lowered so that the metal oxide 552 can become a conductive layer. Such a conductor can be referred to as an OC (Oxide Conductor) electrode.

Note that the metal oxide 552 functions as part of a gate insulating film in some cases. Therefore, when silicon oxide, silicon oxynitride, or the like, which has high thermal stability, is used for the insulating layer 550, a metal oxide that is a high-k material with a high dielectric constant is preferably used as the metal oxide 552. This stacked-layer structure enables the transistor 510D to be thermally stable and have a high dielectric constant. Accordingly, a gate potential applied during operation of the transistor can be lowered while physical thickness of the gate insulator is maintained. In addition, the equivalent oxide thickness (EOT) of an insulating layer having a function as the gate insulator can be reduced.

Although the metal oxide 552 in the transistor 510D is shown as a single layer, the metal oxide 552 may have a stacked-layer structure of two or more layers. For example, a metal oxide having a function as part of a gate electrode and a metal oxide having a function as part of the gate insulating film may be stacked.

When the metal oxide 552 included in the transistor 510D has a function as a gate, the on-state current of the transistor 510D can be increased without weakening the influence of electric fields from the conductive layer 560. When the metal oxide 552 has a function as a gate insulating film, the distance between the conductive layer 560 and the metal oxide 530 can be maintained owing to the physical thickness of the insulating layer 550 and the metal oxide 552. Thus, leakage current between the conductive layer 560 and the metal oxide 530 can be reduced. Consequently, in the transistor 510D having the stacked-layer structure of the insulating layer 550 and the metal oxide 552, it is easy to adjust the physical distance between the conductive layer 560 and the metal oxide 530 and the intensity of electric fields applied from the conductive layer 560 to the metal oxide 530.

Specifically, for the metal oxide 552, a material obtained by lowering the resistance of an oxide semiconductor that can be used for the metal oxide 530 can be used. Alternatively, a metal oxide containing one or more of hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the metal oxide 552 is not an essential structure. Design is appropriately determined in consideration of required transistor characteristics.

The insulating layer 570 is preferably formed using an insulating material having a function of inhibiting the passage of oxygen and impurities such as water or hydrogen. For example, aluminum oxide or hafnium oxide is preferably used. Thus, oxidization of the conductive layer 560 due to oxygen from above the insulating layer 570 can be inhibited. Moreover, entry of impurities such as water or hydrogen from above the insulating layer 570 into the metal oxide 530 through the conductive layer 560 and the insulating layer 550 can be inhibited.

The insulating layer 571 has a function as a hard mask. By providing the insulating layer 571, the conductive layer 560 can be processed to have a side surface that is substantially vertical to the substrate surface; specifically, an angle formed by the side surface of the conductive layer 560 and a surface of the substrate can be within the range of 75° to 100°, preferably within the range of 80° to 95°.

The insulating layer 571 may be formed using an insulating material having a function of inhibiting the passage of oxygen and impurities such as water or hydrogen so that the insulating layer 571 also functions as a barrier layer. In that case, the insulating layer 570 does not have to be provided.

Parts of the insulating layer 570, the conductive layer 560, the metal oxide 552, the insulating layer 550, and the metal oxide 530c are selectively removed using the insulating layer 571 as a hard mask, so that the side surfaces of them are substantially aligned with each other and part of the surface of the metal oxide 530b can be exposed.

In the transistor 510D, part of the exposed surface of the metal oxide 530b includes a region 531a and a region 531b. One of the region 531a and the region 531b functions as a source region, and the other of the region 531a and the region 531b has a function as a drain region.

The region 531a and the region 531b can be formed by, for example, introducing an impurity element such as phosphorus or boron to the exposed surface of the metal oxide 530b by an ion implantation method, an ion doping method, a plasma immersion ion implantation method, plasma treatment, or the like. In this embodiment and the like, an impurity element refers to an element other than main constituent elements.

The region 531a and the region 531b can also be formed in the following manner: a metal film is deposited after part of the surface of the metal oxide 530b is exposed and then the element in the metal film is diffused into the metal oxide 530b by heat treatment.

The electrical resistivity of the regions of the metal oxide 530b to which the impurity element is added decreases. Accordingly, the region 531a and the region 531b are each referred to as an "impurity region" or a "low-resistance region" in some cases.

The region 531a and the region 531b can be formed in a self-aligned manner by using the insulating layer 571 and/or the conductive layer 560 as a mask. Accordingly, the conductive layer 560 does not overlap with the region 531a and/or the region 531b, so that the parasitic capacitance can be reduced. Furthermore, an offset region is not formed between the channel formation region and the source or drain region (the region 531a or the region 531b). The formation of the region 531a and the region 531b in a self-aligned manner achieves an increase in the on-state current, a reduction in the threshold voltage, and an improvement in the operation frequency, for example.

Note that an offset region may be provided between the channel formation region and the source/drain region in order to further reduce the off-state current. The offset region is a region where the electrical resistivity is high and the impurity element is not added. The offset region can be formed by the above-described addition of the impurity element after the formation of an insulating layer 575. In this case, the insulating layer 575 has a function as a mask like the insulating layer 571 or the like. Thus, the impurity element is not added to the region of the metal oxide 530b overlapped with the insulating layer 575, so that the electrical resistivity of the region can be kept high.

In the transistor 510D, the insulating layer 575 is provided on the side surfaces of the insulating layer 570, the conductive layer 560, the metal oxide 552, the insulating layer 550, and the metal oxide 530c. The insulating layer 575 is preferably an insulating layer having a low dielectric constant. The insulating layer 575 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin, for example. In particular, silicon oxide, silicon oxynitride, silicon nitride oxide, or porous silicon oxide is preferably used for the insulating layer 575, in which case an excess-oxygen region can be easily formed in the insulating layer 575 in a later step. Silicon oxide and silicon oxynitride are preferable because of their thermal stability. The insulating layer 575 preferably has a function of diffusing oxygen.

The transistor 510D also includes the insulating layer 574 over the insulating layer 575 and the metal oxide 530. The insulating layer 574 is preferably deposited by a sputtering method. The insulating layer formed by a sputtering method can be an insulating layer containing few impurities such as water or hydrogen. For example, aluminum oxide is preferably used for the insulating layer 574.

Note that an oxide film formed by a sputtering method may extract hydrogen from the component over which the oxide film is formed. For that reason, the insulating layer 574 formed by a sputtering method absorbs hydrogen and water from the metal oxide 530 and the insulating layer 575. This reduces the hydrogen concentration in the metal oxide 530 and the insulating layer 575.

Transistor Structure Example 5

Figure 17A:
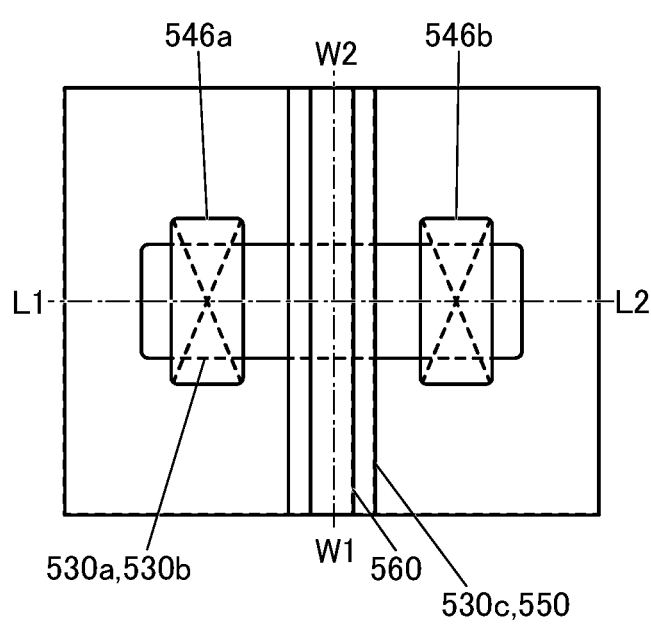
FIG. 17 (A) A top view showing a structure example of a transistor. (B), (C) Cross-sectional views showing a structure example of the transistor.
Figure 17C:
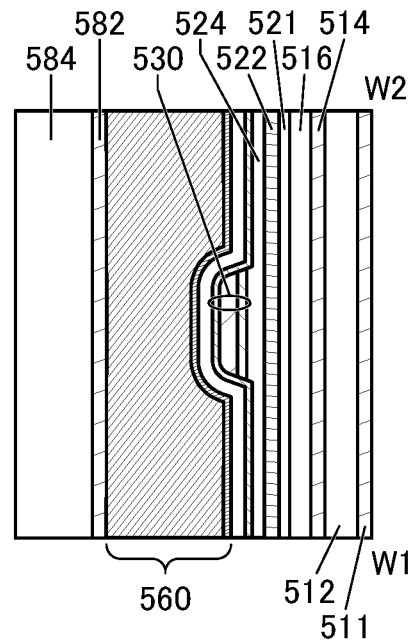
Figure 17B:
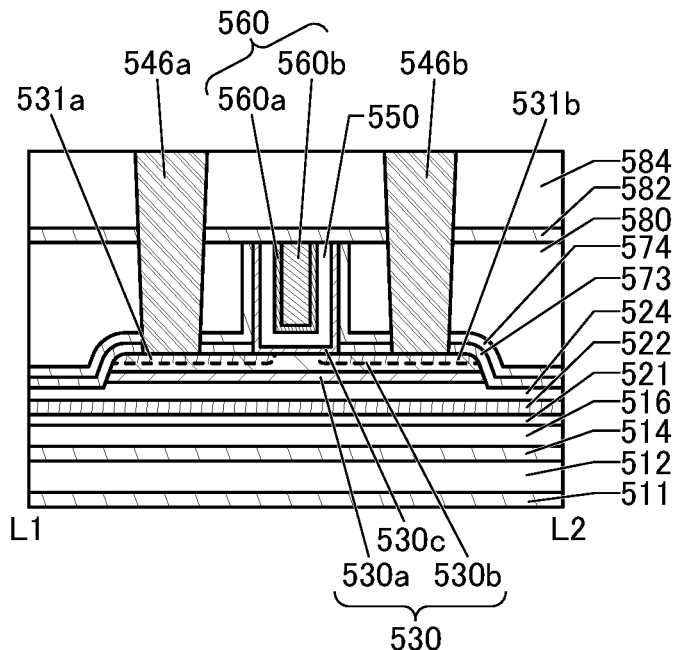

A structure example of a transistor 510E is described with reference to FIGS. 17(A), 17(B), and 17(C). FIG. 17(A) is atop view of the transistor 510E. FIG. 17(B) is a cross-sectional view of a portion indicated by a dashed-dotted line L1-L2 in FIG. 17(A). FIG. 17(C) is a cross-sectional view of a portion indicated by a dashed-dotted line W1-W2 in FIG. 17(A). Note that for clarification of the drawing, some components are not shown in the top view of FIG. 17(A).

The transistor 510E is a variation example of the above transistors. Therefore, differences from the above transistors are mainly described to avoid repeated description.

In the transistor 510E, the conductive layer 542 is not included and part of the exposed surface of the metal oxide 530b includes the region 531a and the region 531b. One of the region 531a and the region 531b functions as a source region, and the other has a function as a drain region. Moreover, an insulating layer 573 is included between the metal oxide 530b and the insulating layer 574.

The regions 531 (the region 531a and the region 531b) shown in FIG. 17 are regions where an element described below is added to the metal oxide 530b. The regions 531 can be formed with the use of a dummy gate, for example.

Specifically, a dummy gate is provided over the metal oxide 530b, and the above element that reduces the resistance of the metal oxide 530b is added using the dummy gate as a mask. That is, the element is added to regions of the metal oxide 530 that are not overlapped by the dummy gate, whereby the regions 531 are formed. For the addition of the element, an ion implantation method by which an ionized source gas is subjected to mass separation and then added, an ion doping method by which an ionized source gas is added without mass separation, a plasma immersion ion implantation method, or the like can be used.

Typical examples of an element that reduces the resistance of the metal oxide 530 include boron and phosphorus. Hydrogen, carbon, nitrogen, fluorine, sulfur, chlorine, titanium, a rare gas element, or the like can also be used. Typical examples of the rare gas include helium, neon, argon, krypton, and xenon. The concentration of the element is measured by secondary ion mass spectrometry (SIMS) or the like.

In particular, boron and phosphorus are preferably used because an apparatus used in a manufacturing line for amorphous silicon or low-temperature polysilicon can be used. Since the existing facility can be used, capital investment can be reduced.

Next, an insulating film to be the insulating layer 573 and an insulating film to be the insulating layer 574 may be formed over the metal oxide 530*b* and the dummy gate. Stacking the insulating film to be the insulating layer 573 and the insulating film to be the insulating layer 574 can provide a region where the region 531, the metal oxide 530*c*, and the insulating layer 550 overlap with each other.

Specifically, after an insulating film to be the insulating layer 580 is provided over the insulating film to be the insulating layer 574, the insulating film to be the insulating layer 580 is subjected to CMP (Chemical Mechanical Polishing) treatment, whereby part of the insulating film to be the insulating layer 580 is removed and the dummy gate is exposed. Then, when the dummy gate is removed, part of the insulating layer 573 in contact with the dummy gate is preferably also removed. Thus, the insulating layer 574 and the insulating layer 573 are exposed at the side surface of the opening provided in the insulating layer 580, and the region 531 provided in the metal oxide 530*b* is partly exposed at the bottom surface of the opening. Next, an oxide film to be the metal oxide 530*c*, an insulating film to be the insulating layer 550, and a conductive film to be the conductive layer 560 are formed in this order in the opening, and then, the oxide film to be the metal oxide 530*c*, the insulating film to be the insulating layer 550, and the conductive film to be the conductive layer 560 are partly removed by CMP treatment or the like until the insulating layer 580 is exposed; thus, the transistor shown in FIG. 17 can be formed.

Note that the insulating layer 573 and the insulating layer 574 are not essential components. Design is appropriately determined in consideration of required transistor characteristics.

The cost of the transistor shown in FIG. 17 can be reduced because an existing apparatus can be used and the conductive layer 542 is not provided.

This embodiment can be combined with any of the other embodiments as appropriate.

Embodiment 3

Examples of a package and a camera module in each of which an image sensor chip is placed are described in this embodiment with reference to drawings. For the image sensor chip, the structure of the imaging device of one embodiment of the present invention can be used.

FIG. 18(A1) is an external perspective view of the top surface side of a package in which an image sensor chip is placed. The package includes a package substrate 610 to which an image sensor chip 650 is fixed shown in FIG. 18(A3), a cover glass 620, an adhesive 630 for bonding them, and the like.

FIG. 18(A2) is an external perspective view of the bottom surface side of the package. A BGA (Ball Grid Array) in which solder balls are used as bumps 640 on the bottom surface of the package is employed. Note that, without being limited to the BGA, an LGA (Land Grid Array), a PGA (Pin Grid Array), or the like may be employed.

FIG. 18(A3) is a perspective view of the package, in which part of the cover glass 620 and the adhesive 630 is not shown. Electrode pads 660 are formed over the package substrate 610, and the electrode pads 660 and the bumps 640 shown in FIG. 18(A2) are electrically connected to each other via through-holes. The electrode pads 660 are electrically connected to the image sensor chip 650 through the wires 670.

Furthermore, FIG. 18(B1) is an external perspective view of the top surface side of a camera module in which an image sensor chip is placed in a package with a built-in lens. The camera module includes a package substrate 611 to which an image sensor chip 651 shown in FIG. 18(B3) is fixed, a lens cover 621, a lens 635, and the like.

FIG. 18(B2) is an external perspective view of the bottom surface side of the camera module. A QFN (Quad Flat No-lead package) structure in which lands 641 for mounting are provided on the bottom surface and side surfaces of the package substrate 611 is employed. Note that this structure is only an example, and a QFP (Quad Flat Package) or the above-mentioned BGA may also be provided.

FIG. 18(B3) is a perspective view of the module, in which parts of the lens cover 621 and the lens 635 are not shown. The lands 641 are electrically connected to electrode pads 661, and the electrode pads 661 are electrically connected to the image sensor chip 651 or the IC chip 690 through wires 671. Furthermore, the IC chip 690 having a function of a driver circuit, a signal conversion circuit, or the like of an imaging device is provided between the package substrate 611 and the image sensor chip 651; thus, the structure as an SiP (System in Package) is formed.

The image sensor chip placed in a package having the above form can be easily mounted on a printed substrate or the like, and the image sensor chip can be incorporated into a variety of semiconductor devices and electronic devices.

This embodiment can be combined with any of the other embodiments as appropriate.

Embodiment 4

In this embodiment, electronic devices having the imaging device of one embodiment of the present invention are described.

Figure 19A:
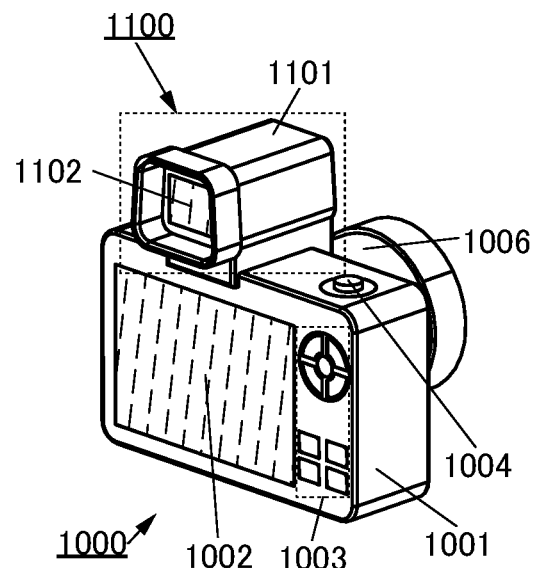
FIG. 19 (A), (B), (C), (D), (E) Diagrams showing electronic devices.

FIG. 19(A) is an external view of a camera 1000 to which a finder 1100 is attached. The camera 1000 can be a digital camera, for example. Note that although the camera 1000 and the finder 1100 are separate and detachable electronic devices in FIG. 19(A), a finder including a display device may be incorporated in a housing 1001 of the camera 1000.

The camera 1000 includes the housing 1001, a display portion 1002, operation buttons 1003, a shutter button 1004, and the like. A detachable lens 1006 is attached to the camera 1000.

Although the lens 1006 of the camera 1000 here is detachable from the housing 1001 for replacement, the lens 1006 may be integrated with the housing.

The camera 1000 can take images at the press of the shutter button 1004. The display portion 1002 functions as a touch panel and images can also be taken at the touch of the display portion 1002.

The housing 1001 of the camera 1000 includes a mount including an electrode, so that the finder 1100, a stroboscope, or the like can be connected to the housing.

The finder 1100 includes a housing 1101, a display portion 1102, and the like. The finder 1100 can be an electronic viewfinder.

The housing 1101 includes a mount for engagement with the mount of the camera 1000 so that the finder 1100 can be attached to the camera 1000. The mount includes an electrode, and an image or the like received from the camera 1000 through the electrode can be displayed on the display portion 1102.

The imaging device of one embodiment of the present invention can be provided in the camera 1000. Accordingly, the camera 1000 can take imaging data corresponding to high-resolution images in a short period. Accordingly, the camera 1000 can be a high-speed camera.

Figure 19B:
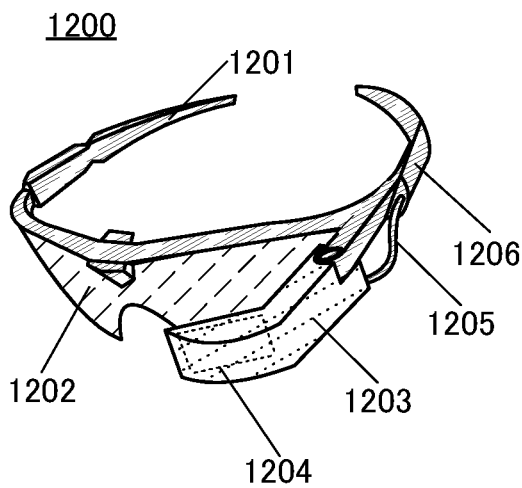

FIG. 19(B) is an external view of a head-mounted display 1200.

The head-mounted display 1200 includes a mounting portion 1201, a lens 1202, a main body 1203, a display portion 1204, a cable 1205, and the like. A battery 1206 is incorporated in the mounting portion 1201.

The cable 1205 supplies electric power from the battery 1206 to the main body 1203. The main body 1203 includes a wireless receiver or the like and can display an image corresponding to the received image data on the display portion 1204. The movement of the eyeball and the eyelid of the user is captured by a camera provided in the main body 1203 and then coordinates of the sight line of the user are calculated using the information to utilize the sight line of the user as an input means.

A plurality of electrodes may be provided in the mounting portion 1201 at a position in contact with the user. The main body 1203 may have a function of sensing current flowing through the electrodes with the movement of the user's eyeball to recognize the user's sight line. The main body 1203 may have a function of sensing current flowing through the electrodes to monitor the user's pulse. The mounting portion 1201 may include various sensors such as a temperature sensor, a pressure sensor, and an acceleration sensor to have a function of displaying the user's biological information on the display portion 1204. The main body 1203 may sense the movement of the user's head or the like to change an image displayed on the display portion 1204 in synchronization with the movement.

The imaging device of one embodiment of the present invention can be provided in the camera provided in the main body 1203 and the sensor provided in the mounting portion 1201. With this structure, the camera can take imaging data correspond to high-resolution images in a short period. Thus, the camera can be a high-speed camera.

Figure 19C:
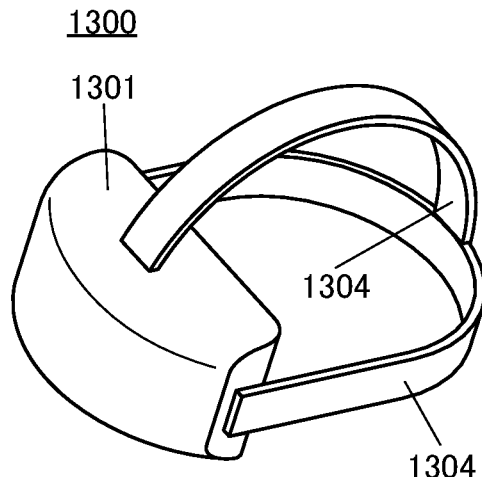
Figure 19D:
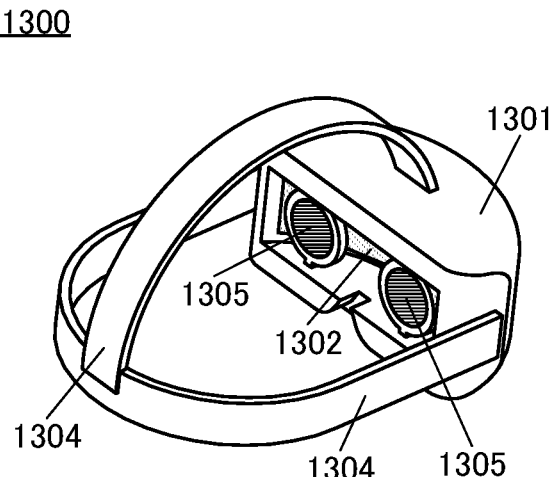
Figure 19E:
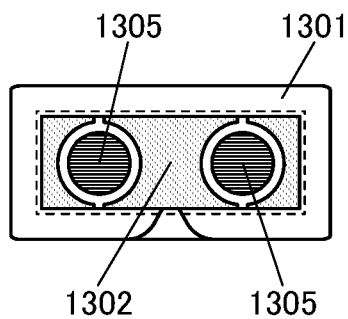

FIGS. 19(C), 19(D), and 19(E) are external views of a head-mounted display 1300. The head-mounted display 1300 includes a housing 1301, a display portion 1302, a band-shaped fixing unit 1304, and a pair of lenses 1305.

A user can see display on the display portion 1302 through the lenses 1305. Note that it is suitable that the display portion 1302 be curved and placed. When the display portion 1302 is curved and placed, a user can feel a high realistic sensation. Note that although the structure in which one display portion 1302 is provided is described in this embodiment as an example, the structure is not limited thereto, and two display portions 1302 may be provided. In that case, one display portion is placed for one eye of the user, so that three-dimensional display using parallax or the like is possible.

The head-mounted display 1300 can be provided with a camera. Accordingly, an outside scene can be captured. The head-mounted display 1300 can synthesize a virtual image such as computer graphics (CG) and an image taken by the camera. The head-mounted display 1300 can be a device for augmented reality (AR).

Figure 20A:
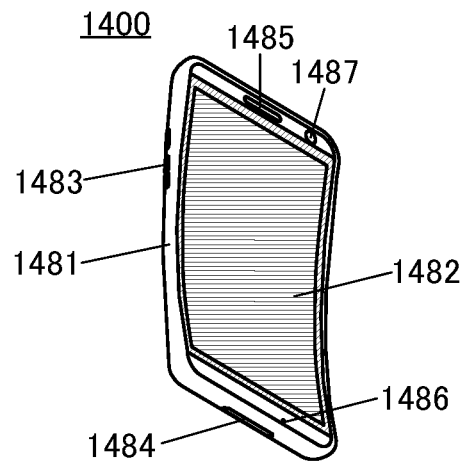
FIG. 20 (A), (B), (C), (D) Diagrams showing electronic devices.

The imaging device of one embodiment of the present invention can be provided as the above camera. Accordingly, the camera can take imaging data corresponding to high-resolution images in a short period. Thus, the camera can be a high-speed camera, FIG. 20(A) is an external view showing an example of a cellular phone 1400. The cellular phone 1400 includes a housing 1481, a display portion 1482, an operation button 1483, an external connection port 1484, a speaker 1485, a microphone 1486, a camera 1487, and the like. The cellular phone includes a touch sensor in the display portion 1482. All operations including making a call and inputting text can be performed by touching the display portion 1482 with a finger, a stylus, or the like.

The imaging device of one embodiment of the present invention can be provided as the camera 1487. Accordingly, the camera 1478 can take imaging data corresponding to high-resolution images in a short period. Thus, the camera 1478 can be a high-speed camera.

Figure 20B:
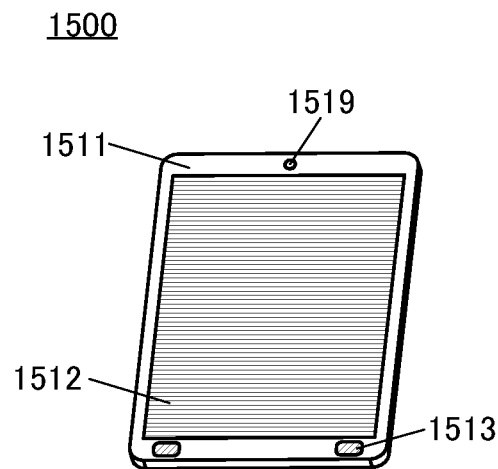

FIG. 20(B) is an external view of a portable information terminal 1500. The portable information terminal 1500 includes a housing 1511, a display portion 1512, speakers 1513, a camera 1519, and the like. A touch panel function of the display portion 1512 enables input and output of information. Furthermore, a character or the like in an image that is captured by the camera 1519 can be recognized and the character can be voice-output from the speakers 1513.

The imaging device of one embodiment of the present invention can be provided as the camera 1519. Accordingly, the camera 1519 can take imaging data corresponding to high-resolution images in a short period. Thus, the camera 1519 can be a high-speed camera.

Figure 20C:
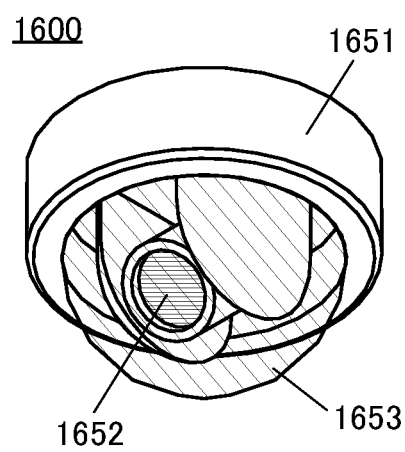

FIG. 20(C) is an external view of a surveillance camera 1600. The surveillance camera 1600 includes a support unit 1651, a camera unit 1652, a protective cover 1653, and the like. The camera unit 1652 is provided with a rotation mechanism and the like and can capture an image of all of the surroundings when provided on a ceiling. Note that a surveillance camera is a name in common use and does not limit the use thereof. A device that has a function of a surveillance camera can also be called a camera or a video camera, for example.

The imaging device of one embodiment of the present invention can be provided as the camera unit 1652. Accordingly, the camera unit 1652 can take imaging data corresponding to high-resolution images in a short period. Thus, the camera unit 1652 can be a high-speed camera.

Figure 20D:
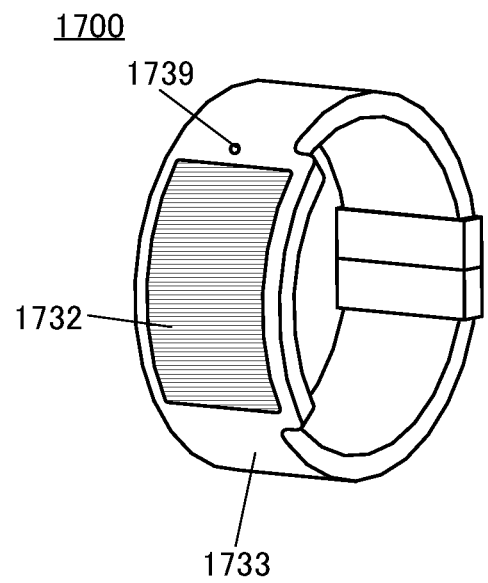

FIG. 20(D) is an external perspective view showing a watch-type information terminal 1700. The information terminal 1700 includes a display portion 1732, a housing and wristband 1733, a camera 1739, and the like. The display portion 1732 is provided with a touch panel for operating the information terminal. The display portion 1732 and the housing and wristband 1733 have flexibility and fit a body well.

The imaging device of one embodiment of the present invention can be provided as the camera 1739. Accordingly, the camera 1739 can take imaging data corresponding to high-resolution images in a short period. Thus, the camera 1739 can be a high-speed camera.

This embodiment can be combined with any of the other embodiments as appropriate.

REFERENCE NUMERALS

10: imaging device, 12: transistor, 12_1: transistor, 12_2: transistor, 13: transistor, 13_1: transistor, 13_2: transistor, 14: transistor, 14_1: transistor, 15: transistor, 15_1: transistor, 15_2: transistor, 16: capacitor, 20: layer, 21: photoelectric conversion element, 30: layer, 30_i: layer, 30_n: layer, 30_1: layer, 30_2: layer, 31: imaging portion, 32: retention circuit, 32_i: retention circuit, 32_n: retention circuit, 32_1: retention circuit, 32_2: retention circuit, 33: gate driver circuit, 33_n: gate driver circuit, 33_1: gate driver circuit, 34: source driver circuit, 34_n: source driver circuit, 34_1: source driver circuit, 35: AD conversion circuit, 35_n: AD conversion circuit, 35_1: AD conversion circuit, 35_2: AD conversion circuit, 36: demultiplexer circuit, 37: multiplexer circuit, 40: wiring, 40_1: wiring, 40_2: wiring, 41: wiring, 41_1: wiring, 412: wiring, 42: wiring, 42_1: wiring, 42_2: wiring, 43: wiring, 43_1: wiring, 43_2: wiring, 44: wiring, 44_1: wiring, 44_2: wiring, 45: wiring, 46: wiring, 47: wiring, 51: exposure operation, 52: retention operation, 53: read operation, 100: substrate, 102: insulating layer, 104: region, 106: region, 108: region, 110: region, 112: insulating layer, 114: insulating layer, 116: insulating layer, 116_1: insulating layer, 116_2: insulating layer, 118: insulating layer, 120: insulating layer, 122: insulating layer, 123: insulating layer, 123_1: insulating layer, 124: insulating layer, 124_1: insulating layer, 126: insulating layer, 126_1: insulating layer, 128: insulating layer, 128_1: insulating layer, 128_2: insulating layer, 130: conductive layer 130_1: conductive layer, 130_2: conductive layer, 130a: conductive layer, 130b: conductive layer, 131: conductive layer, 132: conductive layer, 134: conductive layer, 136: conductive layer, 138: conductive layer, 140: conductive layer, 142: insulating layer, 144: insulating layer, 161: conductive layer, 162: conductive layer, 164: conductive layer, 166: conductive layer, 168: conductive layer, 170: conductive layer, 172: insulating layer, 173: insulating layer, 176: conductive layer, 178: conductive layer, 180: active layer, 182: photoelectric conversion layer, 184: conductive layer, 186: hole-transport layer, 188: electron-transport layer, 202_1: conductive layer, 202_2: conductive layer, 204_1: conductive layer, 204_2: conductive layer, 206_1: conductive layer, 206_2: conductive layer, 208_1: conductive layer, 208_2: conductive layer, 210_1: conductive layer, 210_2: conductive layer, 300: transistor, 324: insulator, 330: metal oxide, 330a: metal oxide, 330b: metal oxide, 330c: metal oxide, 342: conductive layer, 342a: conductive layer, 342b: conductive layer, 343: region, 343a: region, 343b: region, 350: insulating layer, 360: conductive layer, 360a: conductive layer, 360b: conductive layer, 380: insulating layer, 381: light-blocking layer, 382: organic resin layer, 383: coloring layer, 383a: coloring layer, 383b: coloring layer, 383c: coloring layer, 384: microlens array, 385: optical conversion layer, 386: insulating layer, 510A: transistor, 510B: transistor, 510C: transistor, 510D: transistor, 510E: transistor, 511: insulating layer, 512: insulating layer, 514: insulating layer, 516: insulating layer, 521: insulating layer, 522: insulating layer, 524: insulating layer, 530: metal oxide, 530a: metal oxide, 530b: metal oxide, 530c: metal oxide, 531: region, 531a: region, 531b: region, 542: conductive layer, 542a: conductive layer, 542b: conductive layer, 544: insulating layer, 545: insulating layer, 546: conductive layer, 546a: conductive layer, 546b: conductive layer, 547: conductive layer, 547a: conductive layer, 547b: conductive layer, 550: insulating layer, 552: metal oxide, 560: conductive layer, 560a: conductive layer, 560b: conductive layer, 570: insulating layer, 571: insulating layer, 573: insulating layer, 574: insulating layer, 575: insulating layer, 576: insulating layer, 576a: insulating layer, 576b: insulating layer, 580: insulating layer, 582: insulating layer, 584: insulating layer, 610: package substrate, 611: package substrate, 620: cover glass, 621: lens cover, 630: adhesive, 635: lens, 640: bump, 641: land, 650: image sensor chip, 651: image sensor chip, 660: electrode pad, 661: electrode pad, 670: wire, 671: wire, 690: IC chip, 1000: camera, 1001: housing, 1002: display portion, 1003: operation button, 1004: shutter button, 1006: lens, 1100: finder, 1101: housing, 1102: display portion, 1200: head-mounted display, 1201: mounting portion, 1202: lens, 1203: main body, 1204: display portion, 1205: cable, 1206: battery, 1300: head-mounted display, 1301: housing, 1302: display portion, 1304: fixing unit, 1305: lens, 1400: cellular phone, 1481: housing, 1482: display portion, 1483: operation button, 1484: external connection port, 1485: speaker, 1486: microphone, 1487: camera, 1500: portable information terminal, 1511: housing, 1512: display portion, 1513: speaker, 1519: camera, 1600: surveillance camera, 1651: supporting unit, 1652: camera unit, 1653: protection cover, 1700: information terminal, 1732: display portion, 1733: housing and wristband, 1739: camera

What is claimed is:

1. An operation method of an imaging device comprising;
   obtaining first imaging data which is data corresponding to an illuminance of light emitted to a photoelectric conversion element and retaining the first imaging data in a first circuit in a first period,
   obtaining second imaging data which is data corresponding to an illuminance of light emitted to the photoelectric conversion element and retaining the second imaging data in a second circuit in a second period, and
   reading out the first imaging data retained in the first circuit and the second imaging data retained in the second circuit in a third period,
   wherein a first layer comprising the photoelectric conversion element, a second layer comprising the first circuit, and a third layer comprising the second circuit are stacked in the imaging device.

2. The operation method of the imaging device according to claim 1,
   wherein a first AD conversion circuit is provided in the second layer and a second AD conversion circuit is provided in the third layer, and
   wherein in the third period, the first AD conversion circuit converts the first imaging data which is analog data into digital data, and the second AD conversion circuit converts the second imaging data which is analog data into digital data.

3. The operation method of the imaging device according to claim 1,
   wherein in the first period, the first imaging data is obtained with a global shutter mode, and
   wherein in the second period, the second imaging data is obtained with the global shutter mode.

4. An operation method of an imaging device comprising;
   obtaining first imaging data which is data corresponding to an illuminance of light emitted to a photoelectric conversion element retaining the first imaging data in a first circuit in a first period,
   obtaining second imaging data which is data corresponding to an illuminance of light emitted to the photoelectric conversion element retaining the second imaging data in a second circuit in a second period,
   reading out the first imaging data retained in the first circuit in a third period, and reading out the second imaging data retained in the second circuit in a fourth period, wherein the photoelectric conversion element, the first circuit, and the second circuit are stacked in the imaging device.

5. The operation method of the imaging device according to claim 4, the imaging device comprising an AD conversion circuit, wherein in the third period, the AD conversion circuit converts the first imaging data which is analog data into digital data, and wherein in the fourth period, the AD conversion circuit converts the second imaging data which is analog data into digital data.

6. The operation method of the imaging device according to claim 4, wherein in the first period, the first imaging data is obtained with a global shutter mode, and wherein in the second period, the second imaging data is obtained with the global shutter mode.

* * * * *